(12) United States Patent
Dabbagh Rezaei et al.

(10) Patent No.: US 12,149,267 B2
(45) Date of Patent: Nov. 19, 2024

(54) T-SWITCH WITH SHUNT FOR IMPROVED RECEIVER SENSITIVITY

(71) Applicant: QUALCOMM Incorporated, San Diego, CA (US)

(72) Inventors: Vahid Dabbagh Rezaei, San Diego, CA (US); Ahmed Abbas Mohamed Helmy, San Diego, CA (US); Prakash Thoppay Egambaram, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/310,453

(22) Filed: May 1, 2023

(65) Prior Publication Data

US 2023/0275602 A1     Aug. 31, 2023

Related U.S. Application Data

(63) Continuation of application No. 17/327,285, filed on May 21, 2021, now Pat. No. 11,658,689.

(60) Provisional application No. 63/045,787, filed on Jun. 29, 2020.

(51) Int. Cl.
*H04B 1/00*     (2006.01)
*H03K 3/2885*     (2006.01)

(52) U.S. Cl.
CPC .......... *H04B 1/006* (2013.01); *H03K 3/2885* (2013.01)

(58) Field of Classification Search
CPC .... H04B 1/006; H04B 1/0064; H04B 1/0067; H04B 1/16; H04B 1/22; H04B 1/7117; H04L 1/06; H04L 1/0631; H04L 25/0204; H03K 3/2885

USPC ............... 375/260, 267, 316, 324, 328, 349; 455/132, 146, 160.1, 188.1, 189.1, 207, 455/225, 251.1, 253.2, 272, 292, 293, 335

See application file for complete search history.

(56) References Cited

U.S. PATENT DOCUMENTS

| | | |
|---|---|---|
| 5,180,932 A | 1/1993 | Bengel |
| 6,040,732 A | 3/2000 | Brokaw |
| 8,212,604 B2 | 7/2012 | Dianbo |

(Continued)

FOREIGN PATENT DOCUMENTS

JP     2012186702 A     9/2012

OTHER PUBLICATIONS

International Search Report and Written Opinion—PCT/US2021/033917—ISA/EPO—Sep. 16, 2021.

*Primary Examiner* — Young T. Tse
(74) *Attorney, Agent, or Firm* — Polsinelli

(57) ABSTRACT

Aspects of the disclosure relate to devices, wireless communication apparatuses, methods, and circuitry for a t-switch with gate shunting. One aspect is an apparatus including a first differential switch having a control input. The apparatus further includes a second differential switch coupled to the first differential switch, the second differential switch a control input. A shunt capacitor is coupled between a first output and a second output of the first differential switch, and a first input and a second input of the second differential switch. A first shunt switch having a control input, an input, and an output has the input and the output coupled to the control input of the first differential switch. A second shunt switch having a control input, an input, and an output, has the input and the output coupled to the control input of the second differential switch.

19 Claims, 16 Drawing Sheets

(56) References Cited

U.S. PATENT DOCUMENTS

| | | |
|---|---|---|
| 9,014,867 B2 | 4/2015 | Divan et al. |
| 10,574,287 B1 * | 2/2020 | Thoppay Egambaram ................ H03F 3/245 |
| 10,693,231 B2 | 6/2020 | Dunworth et al. |
| 2014/0113573 A1 | 4/2014 | Khatri et al. |
| 2015/0200690 A1 * | 7/2015 | Youssef ................. H04L 5/14 455/73 |
| 2016/0204966 A1 | 7/2016 | Kim et al. |
| 2017/0126120 A1 | 5/2017 | Chakraborty et al. |
| 2018/0323857 A1 * | 11/2018 | Sridharan ............ H04B 7/0842 |
| 2019/0221149 A1 | 7/2019 | Li et al. |
| 2019/0319607 A1 * | 10/2019 | Srirattana ................ H03F 3/72 |
| 2020/0083924 A1 | 3/2020 | Callender et al. |
| 2020/0106398 A1 * | 4/2020 | Abbas Mohamed Helmy ............ H03F 1/565 |
| 2020/0169248 A1 | 5/2020 | Ju et al. |
| 2020/0321994 A1 * | 10/2020 | Alam ................. H04L 25/0272 |
| 2021/0050846 A1 | 2/2021 | Guo et al. |
| 2021/0067183 A1 * | 3/2021 | Abbasi ................... H03F 1/565 |
| 2021/0266052 A1 * | 8/2021 | Fernando .............. H04B 1/401 |
| 2021/0409040 A1 | 12/2021 | Dabbagh Rezaei |

* cited by examiner

1150

1152

CONTROLLING SWITCHING CIRCUITRY OF A CIRCUIT IN A FIRST MODE TO ISOLATE AN INPUT OF THE SWITCHING CIRCUITRY FROM AN OUTPUT OF THE SWITCHING CIRCUITRY WITH FIRST CONTROL SIGNALS CONFIGURED TO: SELECT AN OPEN CONFIGURATION FOR A FIRST SWITCH AND AN OPEN CONFIGURATION FOR A SECOND SWITCH, THE FIRST SWITCH HAVING AN INPUT, AN OUTPUT, AND A CONTROL INPUT FOR THE FIRST CONTROL SIGNALS, AND THE SECOND SWITCH HAVING AN OUTPUT, AN INPUT COUPLED TO THE OUTPUT OF THE FIRST SWITCH, AND A CONTROL INPUT FOR THE CONTROL SIGNALS; AND SELECT A CLOSED CONFIGURATION FOR A FIRST SHUNT SWITCH AND A SECOND SHUNT SWITCH, THE FIRST SHUNT SWITCH CONFIGURED TO SHUNT PARASITIC TRANSMISSION PATH SIGNALS FROM THE FIRST SWITCH WHEN THE FIRST SWITCH IS IN THE OPEN CONFIGURATION AND THE FIRST SHUNT SWITCH IS IN THE CLOSED CONFIGURATION, AND THE SECOND SHUNT SWITCH CONFIGURED TO SHUNT PARASITIC TRANSMISSION PATH SIGNALS FROM THE SECOND SWITCH WHEN THE SECOND SWITCH IS IN THE OPEN CONFIGURATION AND THE SECOND SHUNT SWITCH IS IN THE CLOSED CONFIGURATION

1154

CONTROLLING THE SWITCHING CIRCUITRY OF THE CIRCUIT IN A SECOND MODE TO CONNECT THE INPUT OF THE SWITCHING CIRCUITRY TO THE OUTPUT OF THE SWITCHING CIRCUITRY WITH SECOND CONTROL SIGNALS CONFIGURED TO: SELECT A CLOSED CONFIGURATION FOR THE FIRST SWITCH AND A CLOSED CONFIGURATION FOR THE SECOND SWITCH; AND SELECT AN OPEN CONFIGURATION FOR THE FIRST SHUNT SWITCH AND THE SECOND SHUNT SWITCH

FIG. 11B

T-SWITCH WITH SHUNT FOR IMPROVED RECEIVER SENSITIVITY

CROSS-REFERENCE TO RELATED APPLICATIONS

This application is a continuation of U.S. Non-Provisional application Ser. No. 17/327,285, filed, May 21, 2021, which claims the benefit of U.S. Provisional Application No. 63/045,787, filed, Jun. 29, 2020, both of which are hereby incorporated by reference, in their entirety and for all purposes.

TECHNICAL FIELD

This present disclosure generally relates to electronic communications and, more specifically, to devices, wireless communication apparatuses, and circuitry implementing a t-switch with gate shunting for improved receiver sensitivity, for example within multi-band multi-carrier wireless receivers.

BACKGROUND

Many of the services provided by electronic devices in the current interconnected world depend at least partly on electronic communications. Electronic communications can include those exchanged between or among distributed electronic devices using wireless or wired signals that are transmitted over one or more networks, such as the Internet or a cellular network. Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

Multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. 5G NR includes services associated with enhanced mobile broadband (eMBB), massive machine type communications (mMTC), and ultra-reliable low latency communications (URLLC). Some aspects of 5G NR may be based on the 4G Long Term Evolution (LTE) standard.

Electronic devices are expected to be able to handle different types of wireless communications. However, different electronic devices are expected to meet different size, cost, power usage, or other constraints. Consequently, electrical engineers and other designers of electronic devices strive to enable electronic devices to handle wireless communications of different types while taking into account efficiency and performance constraints.

SUMMARY

Disclosed are systems, apparatuses, methods, and computer-readable media for electronic communications and, more specifically, to devices, wireless communication apparatuses, and circuitry implementing a t-switch with gate shunting for improved receiver sensitivity, for example within multi-band multi-carrier wireless receivers. Some aspects of t-switch circuitry as described herein improve the operation of wireless receivers by improving isolation of receive channels in a multi-band multi-carrier device. Some aspects of t-switch circuitry described herein additionally improve device performance while maintaining or improving device reliability due to the structure of the t-switch circuitry, as described in detail below.

In one example, a, wireless communication apparatus is provided. The wireless communication apparatus comprises a first differential switch having a first differential input, a first differential output, and a first control input. The apparatus includes a second differential switch having a second differential input connected to the first differential output, a second differential output, and a second control input. The apparatus includes a shunt capacitor coupled between a first input of the first differential output and a second input of the first differential output, wherein the shunt capacitor is further coupled between a first input of the second differential input and a second input of the second differential input. The apparatus includes first shunt switch having a third control input, a third input, and a third output, wherein the third input and the third output are coupled across the first control input. The apparatus includes a second shunt switch having a fourth control input, a fourth input, and a fourth output, wherein the fourth input and the fourth output are coupled across the second control input.

In one example, a method is provided. The method comprises controlling switching circuitry of a circuit in a first mode to isolate an input of the switching circuitry from an output of the switching circuitry with first control signals configured to: select an open configuration for a first switch and an open configuration for a second switch, the first switch having an input, an output, and a control input for the first control signals, and the second switch having an output, an input coupled to the output of the first switch, and a control input for the control signals; and select a closed configuration for a first shunt switch and a second shunt switch, the first shunt switch configured to shunt parasitic transmission path signals from the first switch when the first switch is in the open configuration and the first shunt switch is in the closed configuration, and the second shunt switch configured to shunt parasitic transmission path signals from the second switch when the second switch is in the open configuration and the second shunt switch is in the closed configuration; and controlling the switching circuitry of the circuit in a second mode to connect the input of the switching circuitry to the output of the switching circuitry with second control signals configured to: select a closed configuration for the first switch and a closed configuration for the second switch; and select an open configuration for the first shunt switch and the second shunt switch.

In one example, a wireless communication apparatus is provided. The wireless communication apparatus comprises means for controlling switching circuitry of a circuit in a first mode to isolate an input of the switching circuitry from an output of the switching circuitry with first control signals configured to: select an open configuration for a first means for switching and an open configuration for a second means for switching; and select a closed configuration for a third means for switching and a fourth means for switching, the first means for switching configured to shunt parasitic transmission path signals from the first means for switching in the open configuration, and the fourth means for switching configured to shunt parasitic transmission path signals from the second means for switching the open configuration; and means for controlling the switching circuitry of the circuit in a second mode to connect the input of the switching circuitry to the output of the switching circuitry with second control signals.

In one example, another wireless communication apparatus is provided. The wireless communication apparatus comprises a first differential switch having a first and a second input, a first and a second output, and a control input; a second differential switch having a first and second input coupled to the respective first and second output of the first differential switch, the second differential switch further having a first and second output, and a control input; a shunt capacitor coupled between the first output and the second output of the first differential switch, the shunt capacitor further coupled between the first input and the second input of the second differential switch t; a first shunt switch having a control input, an input, and an output, the input and the output coupled to the control input of the first differential switch; and a second shunt switch having a control input, an input, and an output, the input and the output coupled to the control input of the second differential switch.

In some examples, the first differential switch comprises a first transistor and a second transistor, where the first input of the first differential input comprises a first terminal of the first transistor, and where the second input of the first differential input comprises a first terminal of the second transistor. Some such examples are configured where the first input of the first differential output comprises a second terminal of the first transistor, where the second input of the first differential output comprises a second terminal of the second transistor, and where the first control input comprises a gate of the first transistor and a gate of the second transistor.

In some examples, the first differential switch comprises a first transistor and a second transistor, where the first input of the first differential input comprises a source of the first transistor, and where the second input of the first differential input comprises a source of the second transistor. Some such examples are configured where the first input of the first differential output comprises a drain of the first transistor, where the second input of the first differential output comprises a drain of the second transistor, and where the first control input comprises a gate of the first transistor and a gate of the second transistor.

Some examples are configured where the first shunt switch comprises a third transistor having a drain coupled to the gate of the first transistor and a source coupled to the gate of the second transistor, and where the third control input comprises a gate of the third transistor. Some examples are configured where the second differential switch comprises a fourth transistor and a fifth transistor, where the first input of the second differential input comprises a source of the fourth transistor, where the second input of the second differential input comprises a source of the fifth transistor, where the first input of the second differential output comprises a drain of the fourth transistor, where the second input of the second differential output comprises a drain of the fifth transistor, and where the second control input comprises a gate of the fourth transistor and a gate of the fifth transistor. Some such examples are configured where the second shunt switch comprises a sixth transistor having a drain coupled to the gate of the fourth transistor and a source coupled to the gate of the fifth transistor, and where the fourth control input further comprises a gate of the sixth transistor.

In some examples, the apparatus is configured where the first differential switch, the second differential switch, the shunt capacitor, the first shunt switch, and the second shunt switch are part of a first receive path of a receive circuit.

Some examples are further configured with a transformer having a transformer differential output coupled to the first differential input. Some examples further include a capacitor bank coupled across the transformer differential output. Some examples include the first differential switch, the second differential switch, the first shunt switch, the second shunt switch, and the shunt capacitor are configured as a split differential t-switch.

In some examples, an apparatus further includes a plurality of receive paths reconfigurable to support a plurality of communication bands for a plurality of communication standards, wherein the first receive path can be isolated from a second receive path of the plurality of receive paths using the split differential t-switch. Some such examples include an antenna coupled to a mixer in the first receive path.

Some examples of an apparatus include control circuitry coupled to the first control input, the second control input, the third control input, and the fourth control input. In some such examples, the control circuitry is configured to deselect the first control input and the second control input while selecting the third control input and the fourth control input to open the first differential switch and the second differential switch while closing the first shunt switch and the second shunt switch to isolate the first and second input of the first differential switch from the first and second output of the second differential switch. In some such examples, the control circuitry is configured to select the first control input and the second control input while deselecting the third control input and the fourth control input to close the first differential switch and the second differential switch while opening the first shunt switch and the second shunt switch to couple the first differential input to the second differential output. Some examples include a modem coupled to the control circuitry.

According to at least one example, a wireless communication apparatus is provided comprising a first switching means, a second switching means, a capacitor between the first and second switching means, and means for shunting a leakage signal.

Another example includes a method for operating a switch using control inputs of a wireless apparatus described above. Another example includes instructions in a computer readable storage medium for operating switching circuitry or a switching apparatus as described above.

Another example is a wireless communication apparatus comprising a first single-ended switch having a first input, a first output, and a first control input. The apparatus includes a second single-ended switch having a second input connected to the first output, a second output, and a second control input. The apparatus includes a shunt capacitor coupled between the first output and a reference potential (e.g., a ground), where the shunt capacitor is further coupled between the second input and the reference potential. The apparatus includes a first shunt switch having a third control input, a third input, and a third output, where the third input is coupled to the first control input, and the third output is coupled to the reference potential. the apparatus includes a second shunt switch having a fourth control input, a fourth input, and a fourth output, wherein the fourth input is coupled to the second control input, and the fourth output is coupled to the reference potential.

In some examples, the first single-ended switch comprises a first transistor, the first input comprises a source of the first transistor, the first output comprises a drain of the first transistor, and the first control input comprises a gate of the first transistor. In some such examples, the first shunt switch comprises a third transistor having a drain coupled to the gate of the first transistor and a source coupled to the reference potential, and wherein the third control input comprises a gate of the third transistor. In some such examples the second single-ended switch comprises a second transistor, the second input comprises a source of the second transistor, the second output comprises a drain of the second transistor, and the second control input comprises a gate of the second transistor.

In some examples, the second shunt switch comprises a fourth transistor having a drain coupled to the gate of the second transistor and a source coupled to the reference potential, and wherein the fourth control input further comprises a gate of the fourth transistor. In some such examples, the first single-ended switch, the second single-ended switch, the shunt capacitor, the first shunt switch, and the second shunt switch are part of a first receive path of a receive circuit.

Some examples of an apparatus further include a first mixer of the receive circuit coupled to the second output of the second single-ended switch and a second receive path of the receive circuit. In some such examples, the second output of the second single-ended switch is coupled to an output of the second receive path and the first receive path further comprises a low-noise amplifier (LNA) having an output coupled to the first input. Some examples are configured where the first single-ended switch, the second single-ended switch, the first shunt switch, the second shunt switch, and the shunt capacitor are configured as a split t-switch.

Some such examples include a plurality of receive paths reconfigurable to support a plurality of communication bands for a plurality of communication standards, where the first receive path can be isolated from the second receive path of the plurality of receive paths using the split t-switch. Some examples include an antenna coupled to the LNA.

Some examples include control circuitry coupled to the first control input, the second control input, the third control input, and the fourth control input. In some such examples, the control circuitry is configured to deselect the first control input and the second control input while selecting the third control input and the fourth control input to open the first switch and the second input from the second output. In some such examples, the control circuitry is configured to select the first control input and the second control input while deselecting the third control input and the fourth control input to close the first switch and the second switch while opening the first shunt switch and the second shunt switch to couple the first input to the second output.

Another example is a wireless communication apparatus comprising: switching circuitry comprising a first switch having a first input, a first output, and a first control input and a second switch having a second input electrically coupled to the first output of the first switch, a second output, and a second control input. The switching circuitry further includes a third switch having a third input, a third output, and a third control input, a fourth switch having a fourth input electrically coupled to the third output of the third switch, a fourth output, and a fourth control input, and a capacitor electrically having a first terminal electrically coupled to a first node between the first switch and the second switch and having a second terminal electrically coupled to a second node between the third switch and the fourth switch. The switching circuitry further includes a fifth switch electrically coupled between the first control input and the third control input and a sixth switch electrically coupled between the second control input and the fourth control input.

Some examples operate where the switching circuitry is coupled between a low-noise amplifier (LNA) and a mixer. Some examples operate where the LNA has a differential output, the first input of the first switch and the third input of the third switch configured to receive a differential signal output by the LNA. Some such examples operate where the LNA is a first LNA, wherein the mixer is coupled to a receive circuit having a second LNA. Some examples operate where the LNA is further connected to a receive path with another mixer different than the mixer. Some such examples operate where the first switch is a first transistor, wherein the second switch is a second transistor, wherein the third switch is a third transistor, wherein the fourth switch is a fourth transistor, wherein the fifth switch is a fifth transistor, and wherein the sixth switch is a sixth transistor.

Another examples are a wireless communication apparatus comprising switching circuitry comprising a first transistor having a first source, a first drain, and a first gate input. The switching circuitry further includes a second transistor having a second source electrically coupled to the first drain of the first transistor, wherein the second transistor has a second drain and a second gate. The switching circuitry further includes a third transistor having a third source, a third drain, and a third gate. The switching circuitry further includes a fourth transistor having a fourth source electrically coupled to the third drain of the third transistor, wherein the fourth transistor has a fourth drain, and a fourth gate. The switching circuitry further includes a capacitor electrically having a first terminal electrically coupled to a first node between the first drain and the second source, and the capacitor further having a second terminal electrically coupled to a second node between the third drain and the fourth source. The switching circuitry further includes a fifth transistor having a fifth source coupled to the third gate, a fifth drain coupled to the first gate, and a fifth gate. The switching circuitry further includes a sixth transistor having a sixth source coupled to the fourth gate, a sixth drain coupled to the second gate, and a sixth gate.

In some examples, the first gate, the second gate, the third gate, the fourth gate, the fifth gate, and the sixth gate are electrically coupled to control circuitry that selects a switch state for the switching circuitry. In some examples, the switching circuitry is coupled between an LNA and a mixer.

Another example includes an apparatus comprising a first means for switching a high frequency signal and a second means for switching the high frequency electrical signal, and a shunt capacitor, where apparatus is configured as a divided split-t switch having one or more means for shunting a parasitic capacitance leakage signal to increase isolation across the switch at high frequencies.

Additional methods include operations for controlling one or more switches in a receiver circuitry using control inputs of a receiver circuitry described above. Another example includes instructions in a computer readable storage medium for operating one or more t-switches to route a reeve signal between a plurality of mixers, or to isolate a receive channel from one or more additional receive channels in the apparatus, as described above.

This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings, and each claim.

The foregoing, together with other features and embodiments, will become more apparent upon referring to the following specification, claims, and accompanying drawings.

BRIEF DESCRIPTION OF DRAWINGS

Illustrative embodiments of the present application are described in detail below with reference to the following drawing figures:

FIG. 11B is a flowchart illustrating a method in accordance with examples described herein.

DETAILED DESCRIPTION

Figure 1:
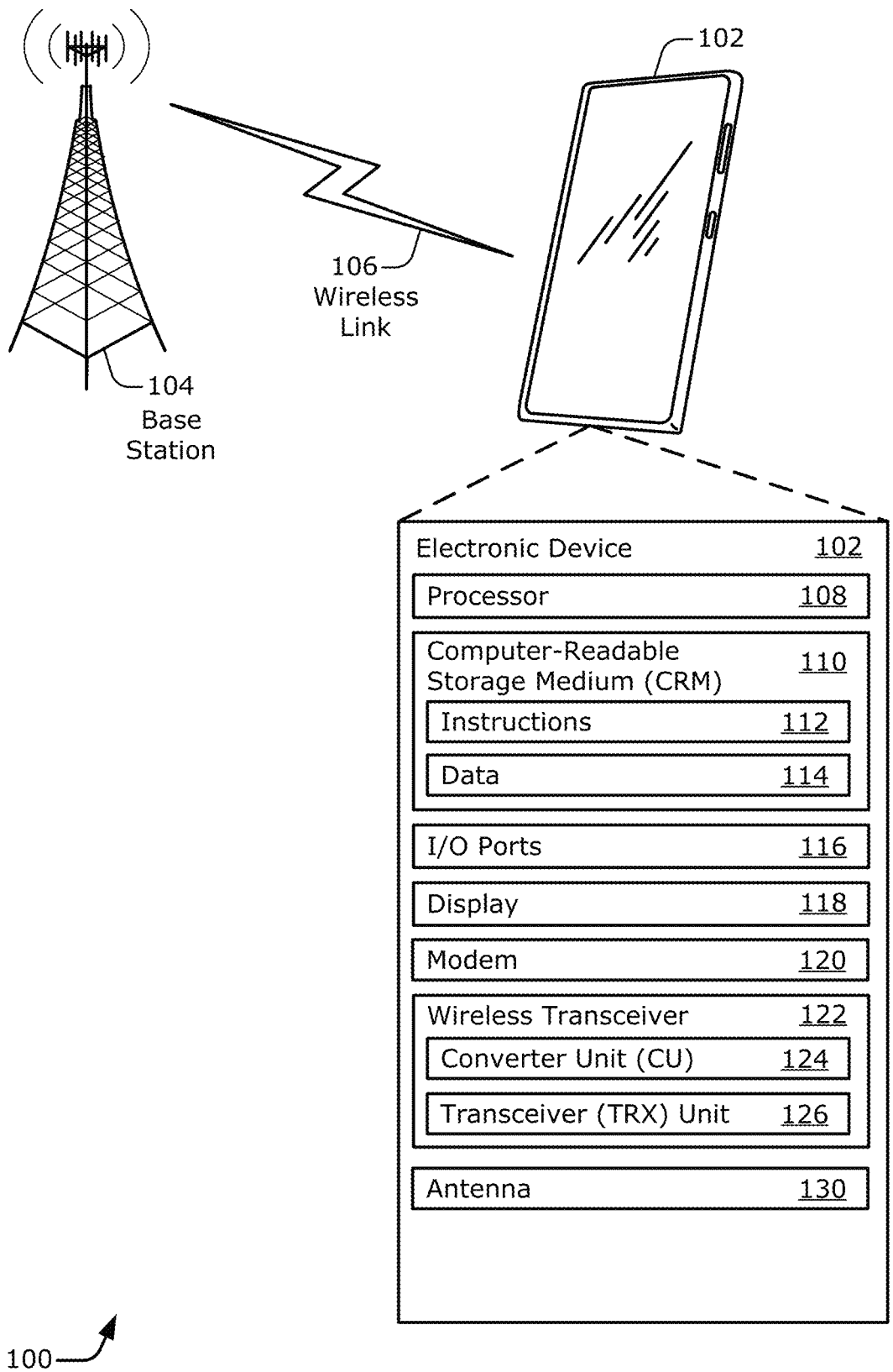
FIG. 1 illustrates an example environment that includes an electronic device having a wireless transceiver in which a receive path can include an implementation of a differential t-switch in accordance with examples described herein.

Certain aspects and embodiments of this disclosure are provided below. Some of these aspects and embodiments may be applied independently and some of them may be applied in combination as would be apparent to those of skill in the art. In the following description, for the purposes of explanation, specific details are set forth in order to provide a thorough understanding of embodiments of the application. However, it will be apparent that various embodiments may be practiced without these specific details. The figures and description are not intended to be restrictive.

The ensuing description provides example embodiments only, and is not intended to limit the scope, applicability, or configuration of the disclosure. Rather, the ensuing description of the exemplary embodiments will provide those skilled in the art with an enabling description for implementing an exemplary embodiment. It should be understood that various changes may be made in the function and arrangement of elements without departing from the spirit and scope of the application as set forth in the appended claims.

Demands for larger data rates and increased throughput have pushed development of wireless protocols, such as the 5G New Radio protocol among others, to specify additional frequency bands along with wider modulation bandwidths. At the same time, wireless devices and wireless transceivers can be designed to support previous communication standards, such as 2G, 3G, and 4G standards under corresponding third generation partnership project (3GPP) wireless communication standards. Additional frequency bands and wider bandwidths used for new communication standards increase coexistence challenges between adjacently operating wireless protocols, particularly where parasitic capacitances can cause difficulties isolating higher frequency signals. Wireless transceivers supporting multi-generational devices can use multiple input radio frequency (RF) ports that are to be connected through multiple communication pipelines (e.g., paths) using a receiver switch matrix (RxSM) for full configurability.

Some RxSM devices are designed to minimize size and circuit area used, which can cause interference and concurrency issues. Interference and concurrency problems can occur, for example, due to limited isolation of multiplexing switches in a compact design. Some RxSM circuit designs that improve isolation have a trade-off between signal losses and switch isolation. The trade-off between signal losses and switch isolation limits the possible isolation in practical devices, particularly for higher frequency communication paths in a device. Examples described herein improve the operation of communication circuitry and communication devices with a t-switch that can improve isolation with a small increase in circuit area. The increased isolation can improve the performance of receiver switch matrix (RxSM) circuits, wireless transceivers, wireless devices (e.g., mobile phones, tablet devices, desktop or personal computer devices with wireless capabilities, tablet computers, wearable devices, extended reality (XR) devices such as virtual reality (VR), augmented reality (AR), and/or mixed reality (MR) devices, among others), and/or other devices or device components with a receive path where performance is impacted by isolation and/or multiple receive paths are tightly integrated.

One example described herein includes an RxSM having a double switch t-structure or split switch t-structure with complementarily-controlled switch shunts at the gates of the two main switches (e.g., which form the double or split switch). The shunt paths cause the signal to cancel itself out at the common node (e.g., across the differential signal path in a differential implementation, or across the signal path to a reference potential in a single-ended implementation), greatly increasing the isolation. The use of a shunt capacitor addresses possible performance issues associated with shunt switch reliability and differential swing. Both differential and single-ended examples are described below.

The use of a t-switch configuration in various designs can improve device operation by enabling additional functionality and improving communication performance. For example, in some devices, the use of the t-switch examples described herein can enable communication concurrency scenarios (e.g., device designs) that were previously prohibited, impracticable, or not useful at a given device size due to interference and throughput drop associated with particular receive path structures. The use of the example t-switches described herein can further enable flexibility for specific band and carrier aggregation combinations in a device that would otherwise have performance issues. In such devices, the t-switch can improve throughput of cases with marginal interference and signal degradation where throughput is reduced due to signal errors. Additional details and specific implementations are described below.

FIG. 1 illustrates an example environment 100 that includes an electronic device 102. In the environment 100, the electronic device 102 communicates with a base station 104 through a wireless communication link 106 (wireless link 106). In such an example, the electronic device 102 is depicted as a smart phone. However, the electronic device 102 may be implemented as any suitable computing or other electronic device, such as a cellular base station, broadband router, access point, cellular or mobile phone, gaming device, navigation device, media device, laptop computer, desktop computer, tablet computer, server, network-attached storage (NAS) device, smart appliance, vehicle-based communication system, Internet-of-Things (IoT) device, and so forth.

The base station 104 communicates with the electronic device 102 via the wireless link 106, which may be implemented as any suitable type of wireless link. Although depicted as a base station tower of a cellular radio network, the base station 104 may represent or be implemented as another device, such as a satellite, cable television head-end, terrestrial television broadcast tower, access point, peer-to-peer device, mesh network node, router, fiber optic line, another electronic device generally, and so forth. Hence, the electronic device 102 may communicate with the base station 104 or another device via a wired connection, a wireless connection, or a combination thereof.

The wireless link 106 can include a downlink of data or control information communicated from the base station 104 to the electronic device 102 and an uplink of other data or control information communicated from the electronic device 102 to the base station 104. The wireless link 106 may be implemented using any suitable communication protocol or standard, such as 3rd Generation Partnership Project Long-Term Evolution (3GPP LTE), 5G New Radio (3GPP 5GNR), IEEE 802.11, IEEE 802.16, Bluetooth™, and so forth.

The electronic device 102 includes a processor 108 and a computer-readable storage medium 110 (CRM 110). The processor 108 may include any type of processor, such as an application processor or a multi-core processor, that is configured to execute processor-executable instructions (e.g., code) stored by the CRM 110. The CRM 110 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the electronic device 102, and thus does not include transitory propagating signals or carrier waves.

The electronic device 102 may also include input/output ports 116 (I/O ports 116) or a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, and so forth. The display 118 can be realized as a screen or projection that presents graphics, e.g. —one or more graphical images, of the electronic device 102, such as for a user interface associated with an operating system, program, or application. Alternatively, or additionally, the display 118 may be implemented as a display port or virtual interface through which graphical content of the electronic device 102 is communicated or presented.

For communication purposes, the electronic device 102 also includes a modem 120, a wireless transceiver 122, and at least one antenna 130. The wireless transceiver 122 provides connectivity to respective networks and other electronic devices connected therewith using radio-frequency (RF) wireless signals. Additionally, or alternatively, the electronic device 102 may include a wired transceiver, such as an Ethernet or fiber optic interface for communicating over a personal or local network, an intranet, or the Internet. The wireless transceiver 122 may facilitate communication over any suitable type of wireless network, such as a wireless local area network (LAN) (WLAN) such as Wi-Fi or Bluetooth, a peer-to-peer (P2P) network, a mesh network, a cellular network (e.g., 3GPP2, 4G LTE, 5G NR, or other cellular network), a wireless wide-area-network (WWAN) (e.g., based on 3GPP2, 4G LTE, 5G NR, etc.), a navigational network (e.g., the Global Positioning System (GPS) of North America or another Satellite Positioning System (SPS)), and/or a wireless personal-area-network (WPAN). In the context of the example environment 100, the wireless transceiver 122 enables the electronic device 102 to communicate with the base station 104 and networks connected therewith. Other figures referenced herein may pertain to other wireless networks.

The modem 120, such as a baseband modem, may be implemented as a system on-chip (SoC) that provides a digital communication interface for data, voice, messaging, and other applications of the electronic device 102. The modem 120 may also include baseband circuitry to perform high-rate sampling processes that can include analog-to-digital conversion (ADC), digital-to-analog conversion (DAC), gain correction, skew correction, frequency translation, and so forth. The modem 120 may also include logic to perform in-phase/quadrature (I/Q) operations, such as synthesis, encoding, modulation, demodulation, and decoding. More generally, the modem 120 may be realized as a digital signal processor (DSP) or a processor that is configured to perform signal processing to support communications via one or more networks. Alternatively, ADC or DAC operations may be performed by a separate component or another illustrated component, such as the wireless transceiver 122.

The wireless transceiver 122 can include circuitry, logic, and other hardware for transmitting or receiving a wireless signal for at least one communication frequency band. In operation, the wireless transceiver 122 can implement at least one radio-frequency transceiver unit to process data and/or signals associated with communicating data of the electronic device 102 via the antenna 130. Generally, the wireless transceiver 122 can include filters, switches, amplifiers, and so forth for routing and processing signals that are transmitted or received via the antenna 130. Generally, the wireless transceiver 122 includes multiple transceiver units (e.g., for different wireless protocols such as WLAN versus WWAN or for supporting different frequency bands or frequency band combinations).

The filters, switches, amplifiers, mixers, and so forth of wireless transceiver 122 can include, in one example, at least one single-ended amplifier, switch circuitry, at least one transformer, at least one differential amplifier, and at least one mixer. In some implementations, the single-ended amplifier, which amplifies a strength of a signal, is coupled to the antenna 130. Thus, the single-ended amplifier can couple a wireless signal to or from the antenna 130 in addition to increasing a strength of the signal. In some implementations, the switch circuitry can switchably couple individual transformers a set of transformers to the single-ended amplifier. The set of transformers provides a physical or electrical separation between the single-ended amplifier and other circuitry of the wireless transceiver 122. The set of transformers also conditions a signal propagating through the set of transformers. Outputs of a transformer can be coupled to one or more mixers. In order to isolate the different receiver paths with different transformers and amplifiers, t-switches can be implemented as described herein between transformers and mixers. Examples of a t-switch are described in detail below.

Some examples can use a differential amplifier at the output of the transformer before the signal is input to a mixer. In such examples, the differential amplifier, like the single-ended amplifier, reinforces a strength of a propagating signal. The wireless transceiver can further perform frequency conversion using a synthesized signal and the mixer. The mixer may include an upconverter and/or a downconverter that performs frequency conversion in a single conversion step, or through multiple conversion steps. The wireless transceiver 122 may also include logic (not shown) to perform in-phase/quadrature (I/Q) operations, such as synthesis, encoding, modulation, demodulation, and decoding using a synthesized signal.

In some cases, components of the wireless transceiver 122, or a transceiver unit 126 thereof, are implemented as separate receiver and transmitter entities. Additionally or alternatively, the wireless transceiver 122 can be realized using multiple or different sections to implement respective receiving and transmitting operations (e.g., using separate transmit and receive chains). Example implementations of a transceiver unit 126 are described below with reference to FIG. 2. In addition, different wireless protocols such as WWAN and WLAN may be implemented on separate chips or as separate System-on-a-Chips (SoCs). As such, the blocks such as the modem 120 and transceiver 122 may represent more than one modem 120 or transceiver implemented either together on separate chips or separate SoCs.

Figure 2:
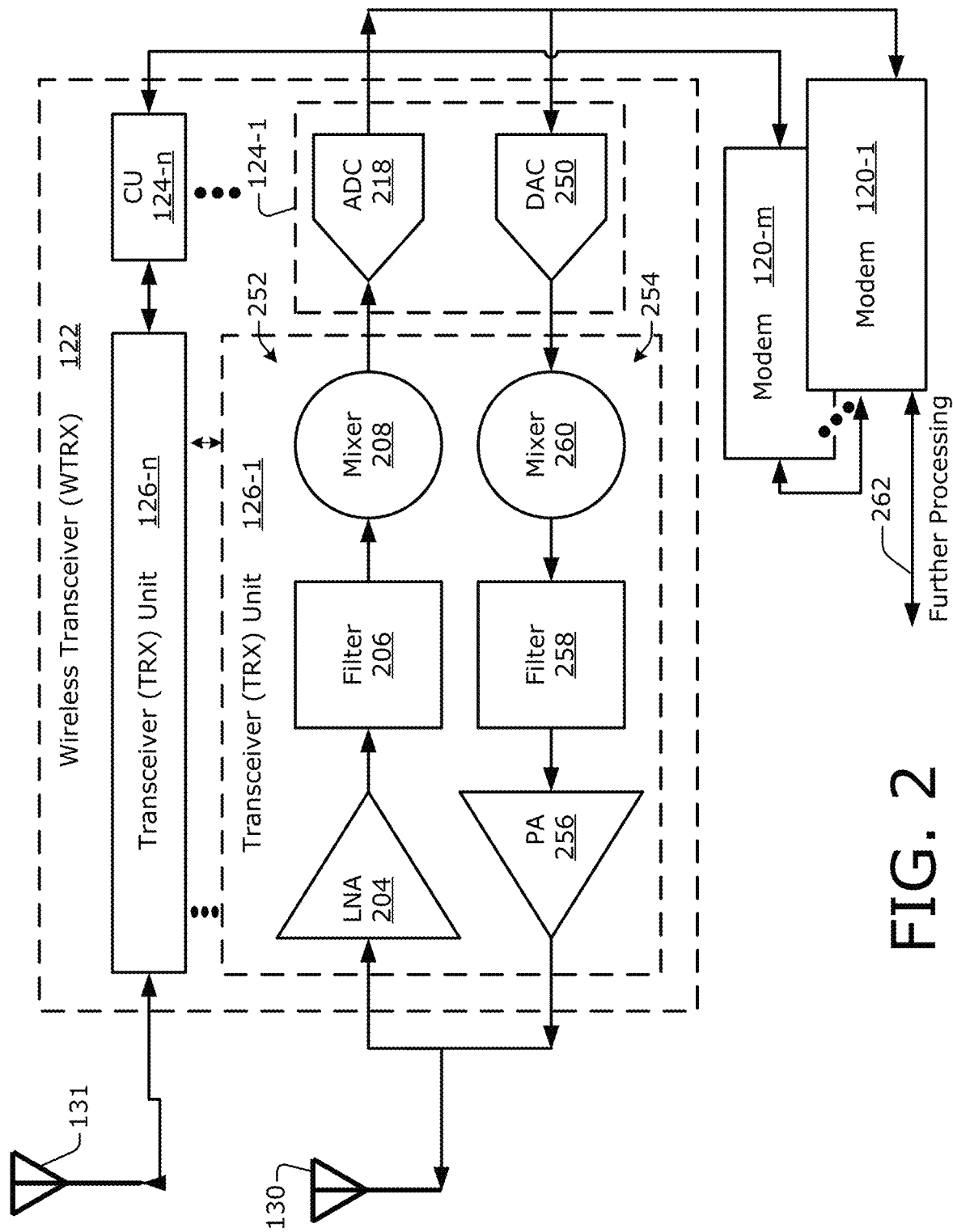
FIG. 2 illustrates an example of a wireless transceiver with transceiver units that can include an implementation of a differential t-switch in accordance with examples described herein.

FIG. 2 illustrates an example of a wireless transceiver 122. In some examples, the components shown in FIG. 2 may be examples of some of the components of the electronic device 102 described with reference to FIG. 1. The wireless transceiver 122 is coupled to one or more of multiple modems 120-1 through 120-m, with "m" representing a positive integer. The wireless transceiver 122 includes one or more transceiver units 126-1 through 126-n, with "n" representing a positive integer. Each of the one or more transceiver units 126-1 through 126-n may be associated with either different wireless protocols or associated with different frequency bands. For example, transceiver unit 126-1 may be associated with a WWAN wireless protocol (e.g., 4G LTE, 5G NR, or other WWAN wireless protocol) and be configured for transmitting or receiving using a particular set of frequency bands. Transceiver unit 126-n may be associated with a WLAN wireless protocol such as Wi-Fi (e.g., in the 2.4 GHz Wi-Fi band or in the 5 GHz Wi-Fi band). Alternatively, transceiver unit 126-n may be associated with a different set of frequency bands of a WWAN wireless protocol as compared to transceiver unit 126-1. As shown, different transceiver units 126-1 through 126n may be connected to different antennas 130 and 131 respectively. Alternatively, certain transceiver units 126-1 through 126-n may share an antenna 130 (e.g., either through a frequency duplexing scheme or a time duplexing scheme and be routed via duplexers/diplexers or using other signal splitting techniques). In addition, there may be further antennas (not shown) for either other transceiver units, for use as diversity antennas, or for multiple-input, multiple-output (MIMO) applications.

As part of the wireless transceiver 122, each transceiver unit 126-1 to 126-n is respectively coupled to an associated converter unit (CU) 124-1 to 124-n. Each converter unit 124, as depicted at the converter unit 124-1, can include an analog-to-digital converter (ADC) 218 or a digital-to-analog converter (DAC) 250. As shown, the transceiver unit 126-1 is coupled to the modem 120-1 (e.g., via the converter unit 124-1), and the transceiver unit 126-n is coupled to the modem 120-m. However, multiple transceiver units 126 can be coupled to a same modem 120. Although only certain components are explicitly depicted in FIG. 2, the wireless transceiver 122 may include other non-illustrated components. Further, the converter units 124-1 to 124-n may be separate from the wireless transceiver 122, such as by being part of a modem 120. The modems 120-1 through 120m may communicate with each other via communication pins (e.g., implementing a general purpose input-output (GPIO) scheme). Data received and processed via the modems 120-1 through 120m may be passed to other portions (e.g., applications processor, DSP, audio processor, and the like) of an electronic device 102 for further processing.

The transceiver unit 126-1 includes a receiver 252 (or receive chain or receive path) and a transmitter 254 (or transmit chain). In some implementations, a transceiver unit 126-1 may include a transmitter 254 (or transmit chain) without a receiver 252 (or receive chain), or vice versa. The receiver 252 includes a low-noise amplifier 204 (LNA 204), a filter 206, and a mixer 208 for frequency down-conversion. The transmitter 254 includes a power amplifier 256 (PA 256), a filter 258, and a mixer 260 for up-conversion. However, the transceiver unit 126-1 can include other components, such as additional amplifiers or multiple mixers, that are disposed anywhere along the depicted receive and transmit chains. These example components can at least partially implement a radio-frequency front-end (RFFE) for the associated electronic device 102. The receiver 252 is coupled between the antenna and the ADC 218, e.g., via the low-noise amplifier 204 and the mixer 208, respectively. The transmitter 254 is coupled between the antenna and the DAC 250, e.g., via the power amplifier 256 and the mixer 260, respectively.

Thus, as shown for the receiver 252 of the transceiver unit 126-1, antenna is coupled to the low-noise amplifier 204, and the low-noise amplifier 204 is coupled to the filter 206. The filter 206 is coupled to the mixer 208, and the mixer 208 is coupled to the ADC 218. The ADC 218 is coupled to, or is part of, the modem 120-1. An example signal-receiving operation that includes the receiver 252 of the transceiver unit 126-1 and the antenna is described below. In some implementations, different transceiver units are associated with different wireless communication technologies, such as WWAN or WLAN. Additionally or alternatively, different transceiver units may provide parallel processing capabilities for a same wireless communication technology.

As part of a signal-transmitting operation, a baseband digital signal is provided to the digital-to-analog converter 250 (DAC 250). The DAC 250 converts the digital signal to an analog signal that is provided the mixer 260. The mixer 260 performs a frequency conversion on the analog signal to up-convert from one frequency to a higher frequency, such as from a baseband frequency to an intermediate frequency (IF) or a radio frequency (RF). The mixer 260 can perform the frequency up-conversion in a single conversion step, or through multiple conversion steps. Thus, the mixer 260 performs a frequency up-conversion operation on the analog signal to produce an up-converted signal and provides the up-converted signal to a filter 258. The filter 258 filters (e.g., low-pass filters or bandpass filters) the up-converted signal by attenuating some ranges of frequencies to produce a filtered signal that has one or more frequency bands attenuated. The filter 258 provides the filtered signal to a power amplifier 256.

Similarly, as part of a signal-receiving operation, a baseband digital signal received via the system above can be processed and output via an analog-to-digital converter (ADC 218) and modem(s) 120 for further processing 262. As part of an example signal-receiving operation, the antenna 130 can receive a signal that is processed via LNA and filter 206. The mixer 208 down converts the analog signal from an IF or RF signal to a baseband signal. ADC 218 then processes the baseband signal to generate a digital signal that is provided to modem(s) 120, and then output for further processing 262. Similar operations can be performed with any number of antennas such as antenna 131, and any number of TRX Units 126 and corresponding CUs 124 and modems 120.

The power amplifier 256 amplifies the filtered signal to produce an amplified signal at a power level appropriate for transmission. The amplifier 256 provides the amplified signal to the antenna 130.

Figure 3:
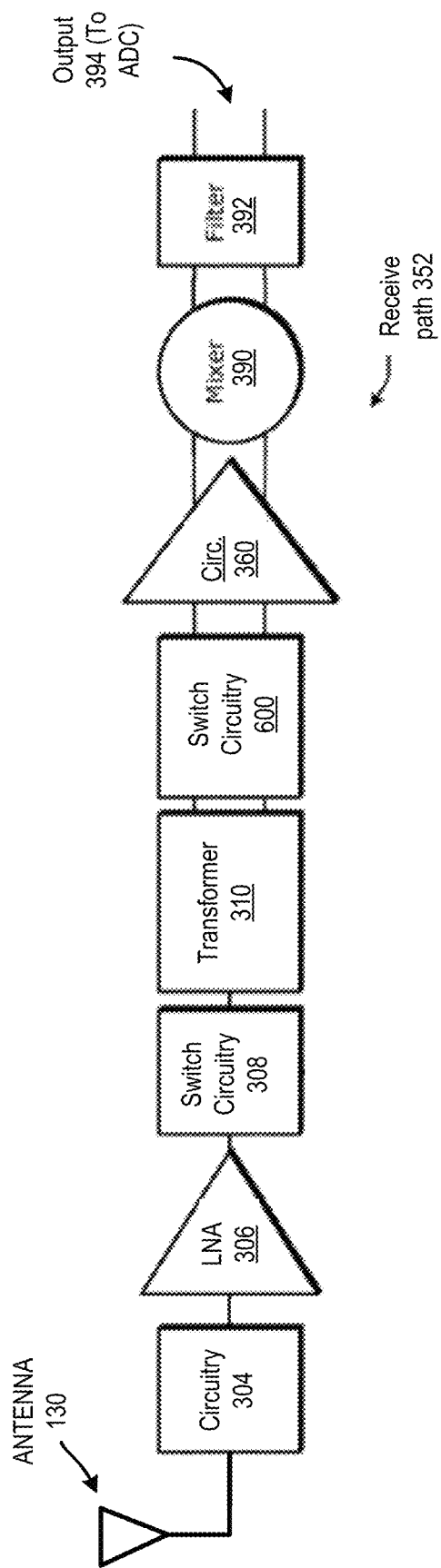
FIG. 3 illustrates a receive path of a wireless transceiver that can include an implementation of a differential t-switch in accordance with examples described herein.

FIG. 3 is a schematic diagram illustrating another example wireless transceiver portion, shown as receive path 352 (e.g., in the receiver 252 of the transceiver 122). The wireless transceiver portion of FIG. 3 includes an alternative receiver path 352. From the left, circuitry 304 (e.g., an input to an RxSM) leads to at least one antenna, such as the antenna 130 of FIG. 1 and FIG. 2. The circuitry 304 is coupled to the amplifier 306, which can be a single-ended low-noise amplifier. The amplifier 306 is coupled to the transformer 310 via the switch circuitry 308. While path 352 shows a single path, additional paths which use part of receive path 352 can also be present as part of a larger circuit (e.g., a receive circuit 400 and/or a switch matrix, as described below), with active paths controlled by one or more switches (e.g., such as a switch of switch circuitry 308). A transformer or balun circuit element can be used in the position described above for converting a signal from single-ended to differential. As detailed below, in an apparatus where the t-switch is single ended and combined with an output from a single ended LNA input to a single-ended t-switch, the transformer can be omitted. Such an example is described in more detail with respect to FIGS. 8 through 10. The transformer 310 is coupled to the switch circuitry 600, which can be a t-switch as described in various implementations below. The switch circuitry 600 is then coupled to the circuitry 360, which can include an amplifier or other such circuitry, and the circuitry 360 is coupled to mixer 390. In some examples, the circuitry 360 is optional and can be omitted. Although not shown in FIG. 3, multiple different receiver paths including the receiver path 352 and other receiver paths can include a single shared mixer 390. The switch circuitry 600 can be configured to increase isolation between the receiver path 352 and other receiver paths coupled to the mixer 390 to improve the performance of the transceiver that includes the receiver path 352. The mixer 390 is coupled to the filter 392 with an output 394. The output 394 of the filter 392 leads to an analog-to-digital converter (ADC), such as the analog-to-digital converter 132-1 of FIG. 2.

As illustrated, the transformer 310 can convert single-ended signals to differential signals in the receive path 352. With the transformer 310, a portion of the receive path 352 to the left of the transformer 310 is a single-ended section, and another portion of the receive path 352 to the right of the transformer 310 is a differential section. In different receive paths other than receive path 352 (e.g., for different frequencies or standard communication implementations), the components in the different receive paths correspond to, and are configured to process signals for, a respective frequency band. The different paths can be similar to the receive path 352, or in a different configuration, depending on a given design.

Figure 4A:
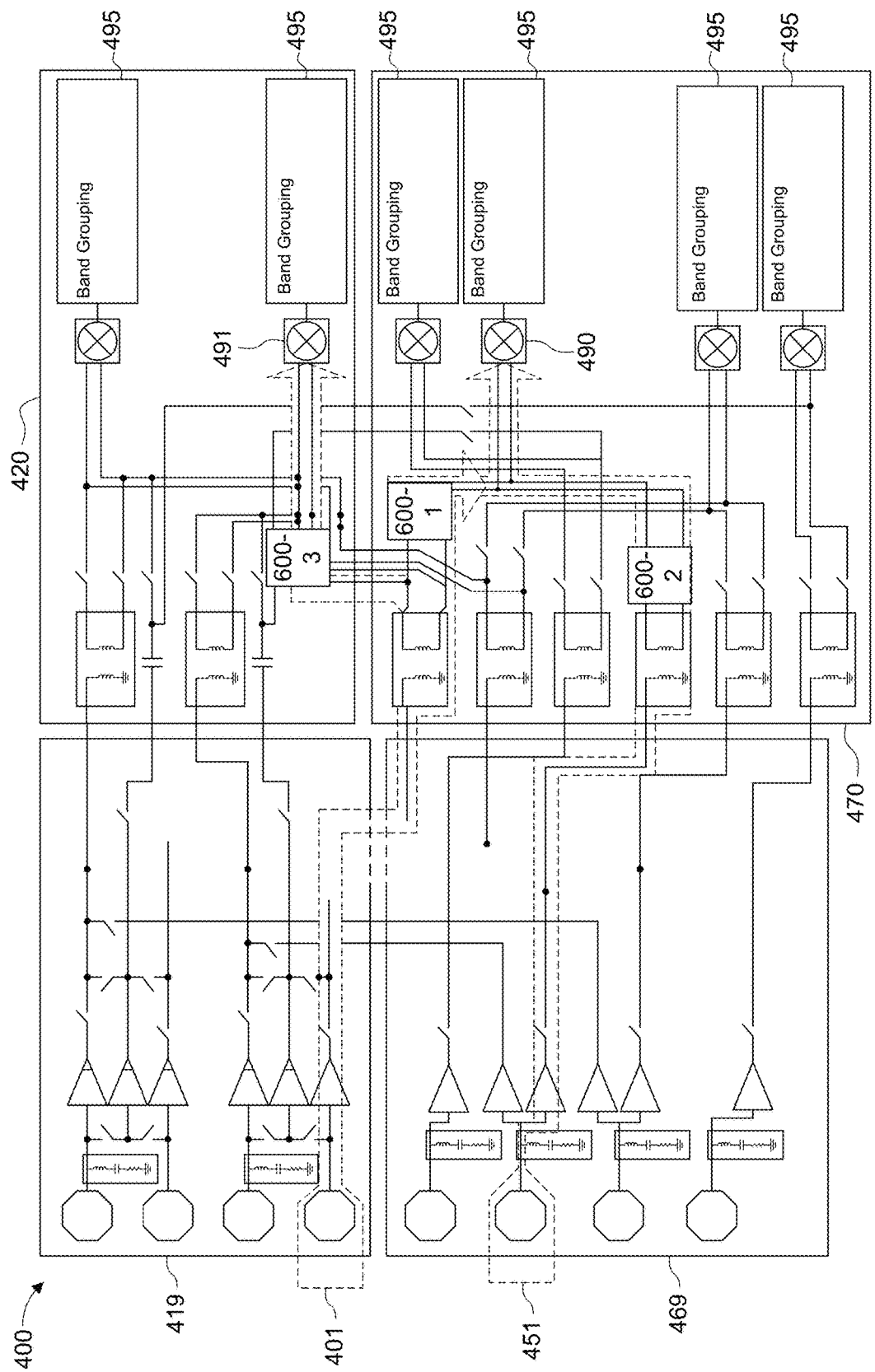
FIG. 4A illustrates aspects of a receiver switch matrix (RxSM) that can include multiple implementations of a differential t-switch in accordance with examples described herein.

FIG. 4A illustrates aspects of a receive circuit 400 that can include multiple implementations of a differential t-switch with a receive circuit switch matrix (RxSM). The receive circuit 400 can be part of an implementation of a wireless transceiver, and can include multiple receive paths to handle communications in multiple different communication bands. As illustrated, the receive circuit 400 is divided into four portions or quadrants solely for purposes of illustration, shown as an upper left quadrant of first band grouping input circuitry 419, a lower left quadrant of second band grouping input circuitry 469, an upper right quadrant of first band grouping downlink connection circuitry 420, and a lower right quadrant of second band grouping downlink connection circuitry 470. The different band groupings 495 can be structured around isolating certain groups of communication bands (e.g., low bands, mid-to-high bands, etc.), but can still be configured for communications between the groupings. As illustrated, inputs to the receive circuit 400 can be received and input to amplifiers in the input circuitry (e.g., the circuitry 419 and the circuitry 469) in different ways, and also routed to different transformers of the connection circuitry 420 and the connection circuitry 470 in different ways. The connection circuitry 420 or the connection circuitry 470 routes signals through transformers and mixers to downlink pipes (DLPs) or downlink paths (e.g., receive paths) depending on the particular band or communication signal type being handled.

The receive circuit 400 is an example with certain receive paths, but a receive circuit can include additional paths and circuitry for additional band groupings 495. As described herein, certain band groupings 495, particular for lower frequencies, may not have isolation issues, in which case the t-switch described herein may be implemented for certain higher frequencies in some examples where the t-switch improves isolation sufficiently to be worth the trade-off in increased circuit size and complexity. In some examples, the described t-switch may be used for higher frequencies as well as lower frequencies. Such different frequency paths that each use a t-switch can, in some examples, be implemented in a single receive circuit switch matrix, so that a single circuit can include one or more t-switches in accordance with aspects described herein.

Figure 4B:
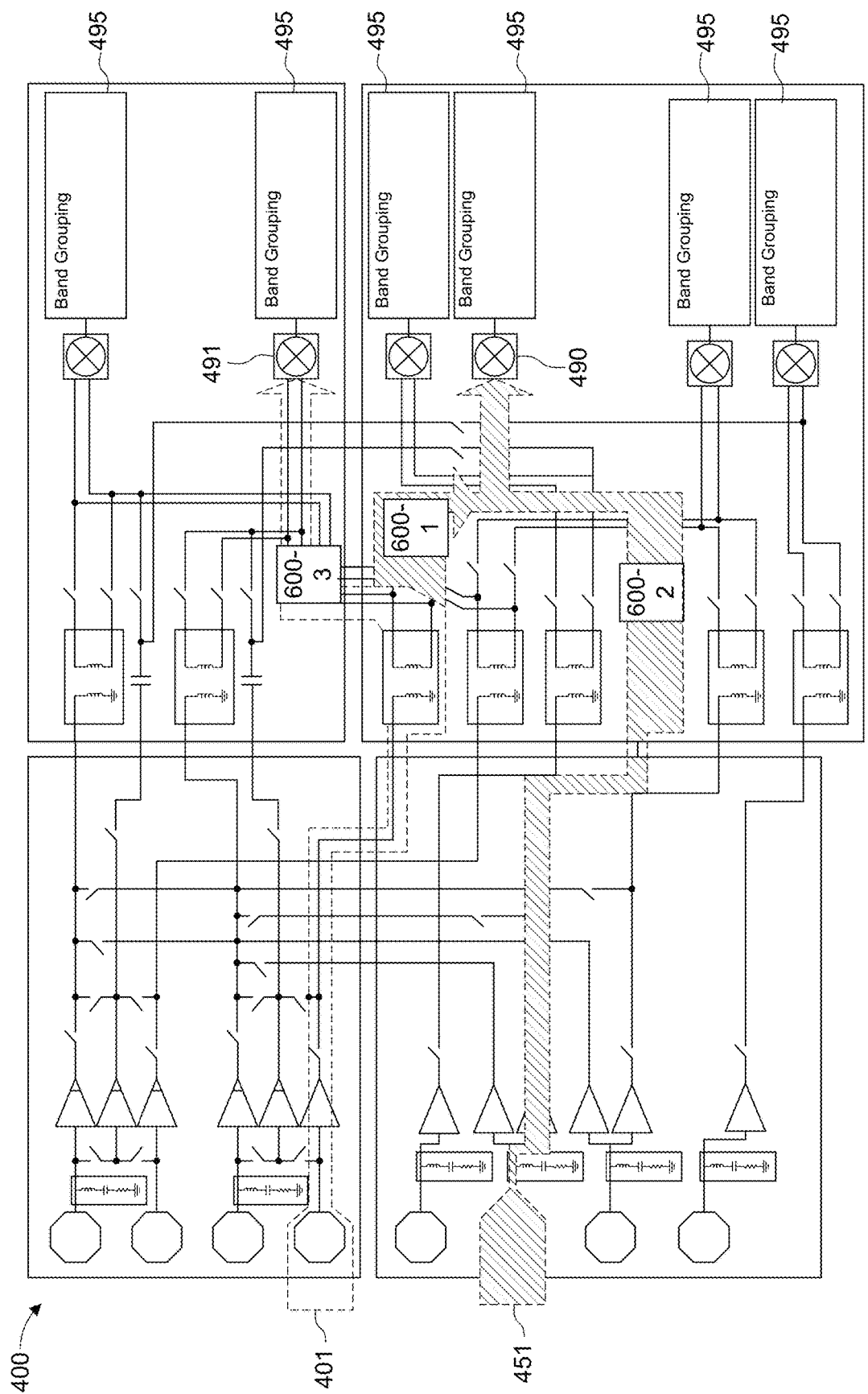
FIG. 4B illustrates aspects of a RxSM that can include multiple implementations of a differential t-switch in accordance with examples described herein.

The receive paths of the receive circuit 400 include a first receive path 401 and a second receive path 451. FIG. 4B emphasizes the second receive path 451 and the area where the first receive path 401 and the second receive path 451 merge to connect to the mixer 490. Thus, as illustrated, the first receive path 401 begins in the first band grouping input circuitry 419 and can be switched to connect to the second band grouping downlink path connection circuitry 470. The second receive path 451 begins in the second band grouping input circuitry 469, and as illustrated, is configured to connect to the second band grouping downlink path connection circuitry 470. The first input portions of both of these paths include switching circuitry to allow connection to other portions of the downlink path connection circuitry, as illustrated in FIG. 4A. In the path configuration as shown, the first receive path 401 includes switch circuitry 600-1 and the second receive path 451 includes switch circuitry 600-2. After the switch circuitry of each path, the paths merge and both include the mixer 490. The mixer 490 is connected by the switch circuitry to a particular path of multiple receive paths of the receive circuit 400. The switch circuitry 600-1 and 600-2 allow the two paths 401 and 451 to be isolated from each other when one path of the two paths 401 and 451 is in use. For example, when the first receive path 401 is in use, the switch circuitry 600-1 can be configured to transmit data to mixer 490, and the switch circuitry 600-2 can be configured to isolate the input portions of the second receive path 451 from the mixer 490. Correspondingly, when the second receive path 451 is in use, the switch circuitry 600-2 can be configured to pass a signal to the mixer 490, and the switch 600-1 can be configured to isolate any signal received at the input portion of the first receive path 401 from the mixer 490. Additionally, as illustrated, switch circuitry as described herein can be used not only to isolate one path from a shared mixer (e.g., the mixer 490 as shared by the first receive path 401 and the second receive path 451), but also to select between two different mixers on one path (e.g., the mixer 491 and the mixer 490 for the first receive path 401). As shown, the switch circuitry 600-1 and the switch circuitry 600-3 can be used in the first receive path 401 to determine whether the signal along the first receive path is sent to the mixer 490 (e.g., with the circuitry 600-1 closed and the circuitry 600-3 open) or the mixer 491 (e.g., with the circuitry 600-3 closed and the circuitry 600-1 open).

Figure 5:
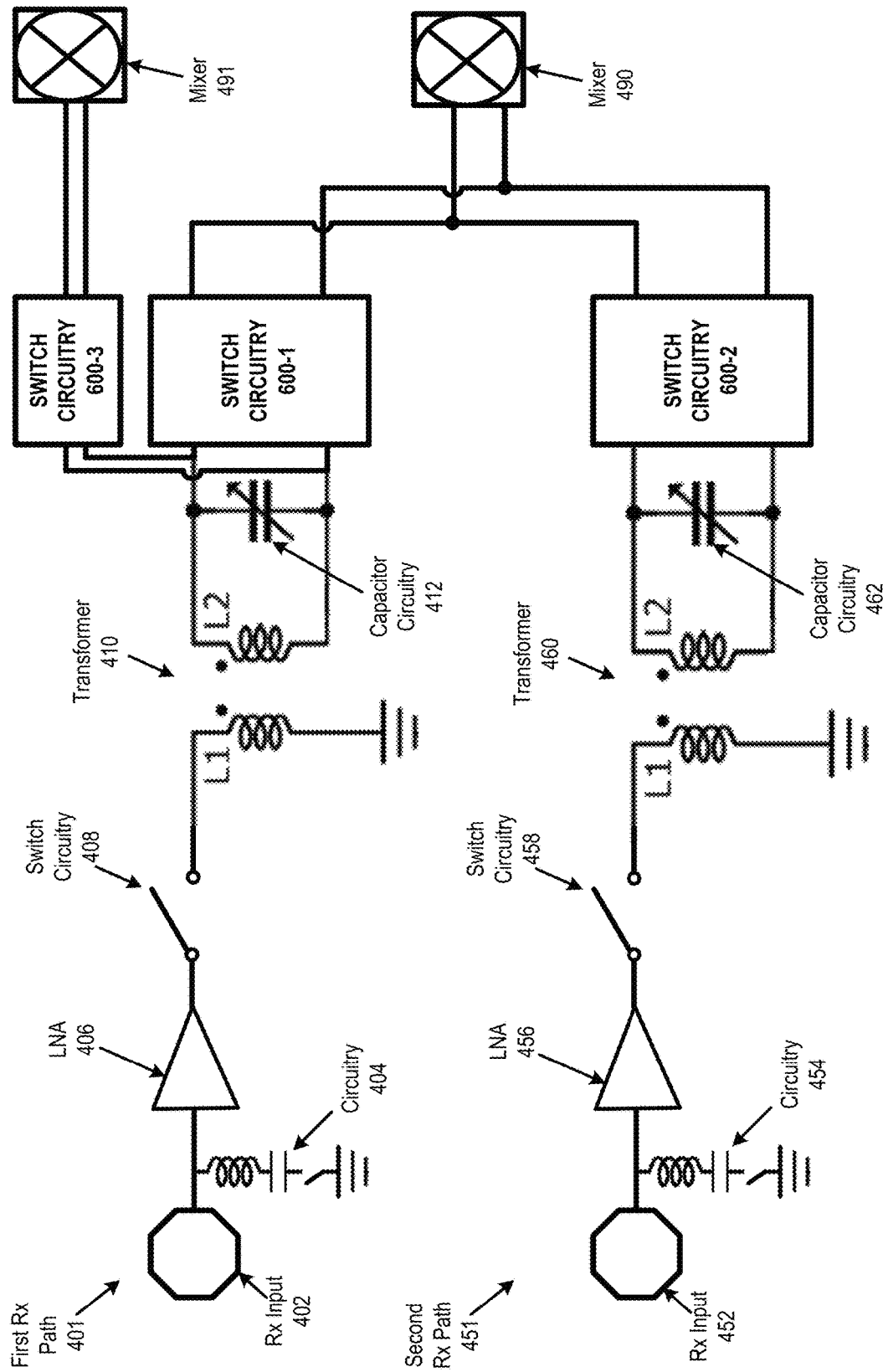
FIG. 5 is a diagram of two receive paths coupled to a single mixer that can include implementations of a differential t-switch in accordance with examples described herein.

FIG. 5 is a diagram illustrating example implementations of the two receive paths 401 and 451 coupled to the same mixer 490 that can include implementations of the differential t-switch. The two paths 401 and 451 of FIG. 5 as illustrated are implementations of first receive path 401 and second receive path 451 of FIG. 4A and FIG. 4B. As shown in FIGS. 4A, 4B, and 5, the receive paths 401 and 451 are similar, with different components to handle different bands or different types of RF signals. First receive path 401 includes a receive input 402 that receives a signal from an antenna (e.g., the antenna 130 or any other such antenna). In some examples, paths 401 and 451 include signal conditioning circuitry. In other examples, such signal conditioning circuitry can include filters and other circuit elements. The signal from the receive input 402 is then input to the low-noise amplifier 406. In some examples as shown in FIG. 4A and FIG. 4B, switching can be included before an amplifier (e.g., before the amplifier 406) in some receive paths. Similarly, different receive paths can have different switching circuitry, such as switch circuitry 408, at the output of amplifier 406 to direct the signal from receive input 402 based on a current communication standard and signal band associated with the input signal. The switch circuitry 408 has a first switch connection (e.g., an input) and a second switch connection (e.g., an output). The second switch connection is coupled to an input of the transformer 410, and the first switch connection is coupled to the LNA 406. The transformer 410 (e.g., which may be a balun) changes the input signal from a single-ended signal (e.g., between the communication path and a reference potential) to a differential signal at the output of the transformer 410. In some examples, capacitor circuitry 412 is included. In other examples, capacitor circuitry 412 can be integrated with switch circuitry (e.g., the switch circuitry 600-1 or 600-2) of a path. In some examples, the capacitor circuitry 412 may include a capacitor bank or any other capacitive element configurable for the particular signal that first receive path 401 is specifically set to receive and process (e.g., for tuning, matching, and the like). In some examples, the capacitor bank can be a selectable set of capacitors. In other examples, the capacitor bank is a tunable capacitive element. The switch circuitry 600-1 is an implementation of a t-switch as detailed below. The switch circuitry 600-1 either connects a received signal to the mixer 490 or isolates the first receive path 401 from the mixer 490, depending on a control input setting for switch circuitry 600-1 (e.g., the control input is not shown in FIG. 5). Similarly, as shown with the mixer 491, the switch circuitry 600-1 can be used with the switch circuitry 600-3 to direct a received signal from an output of the transformer 410 to either the mixer 490 or the mixer 491. In a receive circuit such as the receive circuit 400 (e.g., which can include multiple paths such as those shown in FIG. 5), different combinations of implementations of a t-switch can be used both as part of improved isolation and direction of a received signal along a selected branch (e.g. between the mixer 491 and the mixer 490) as part of a receive path.

Figure 6:
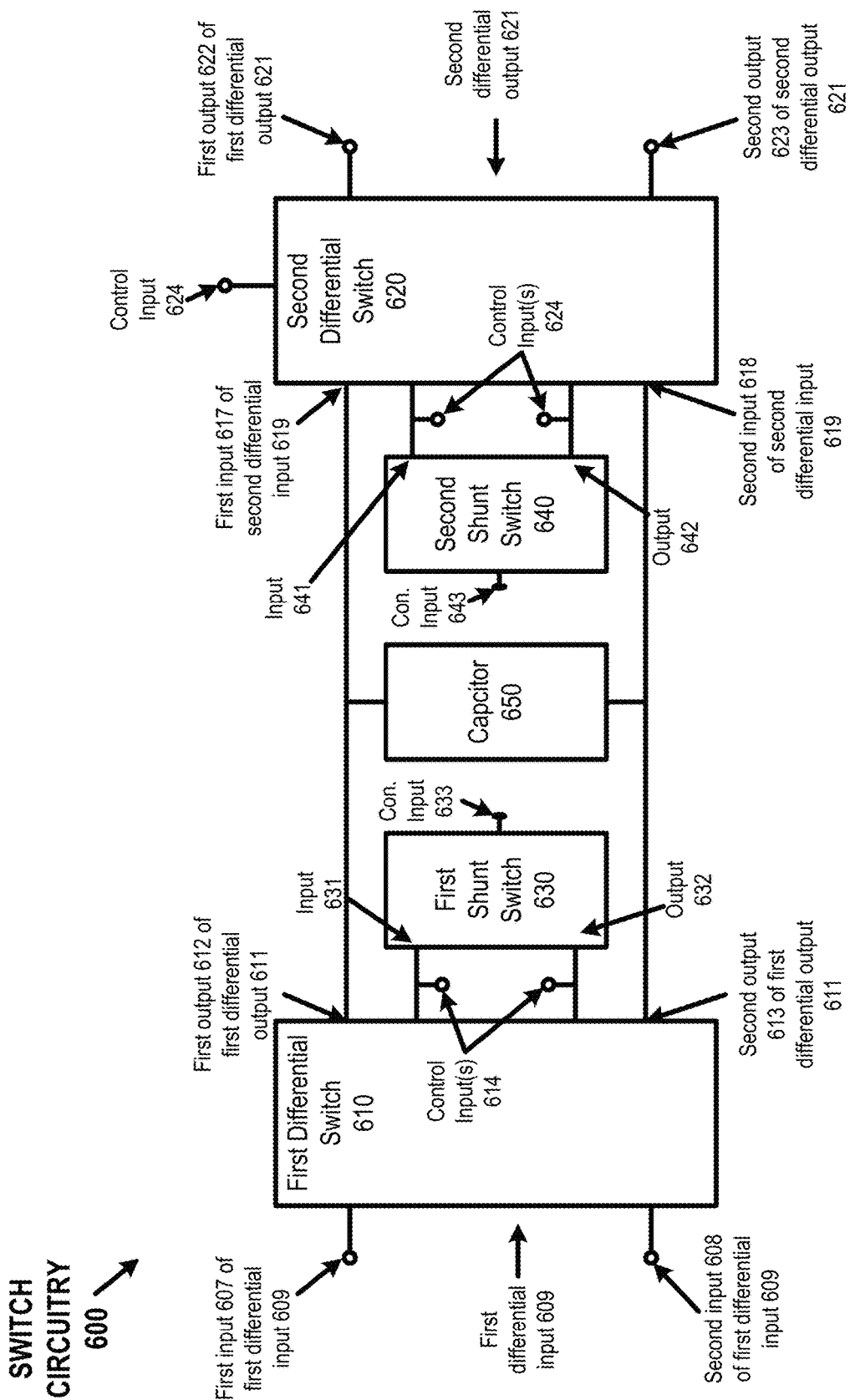
FIG. 6 is a block diagram of a differential t-switch in accordance with some examples described herein.
Figure 7A:
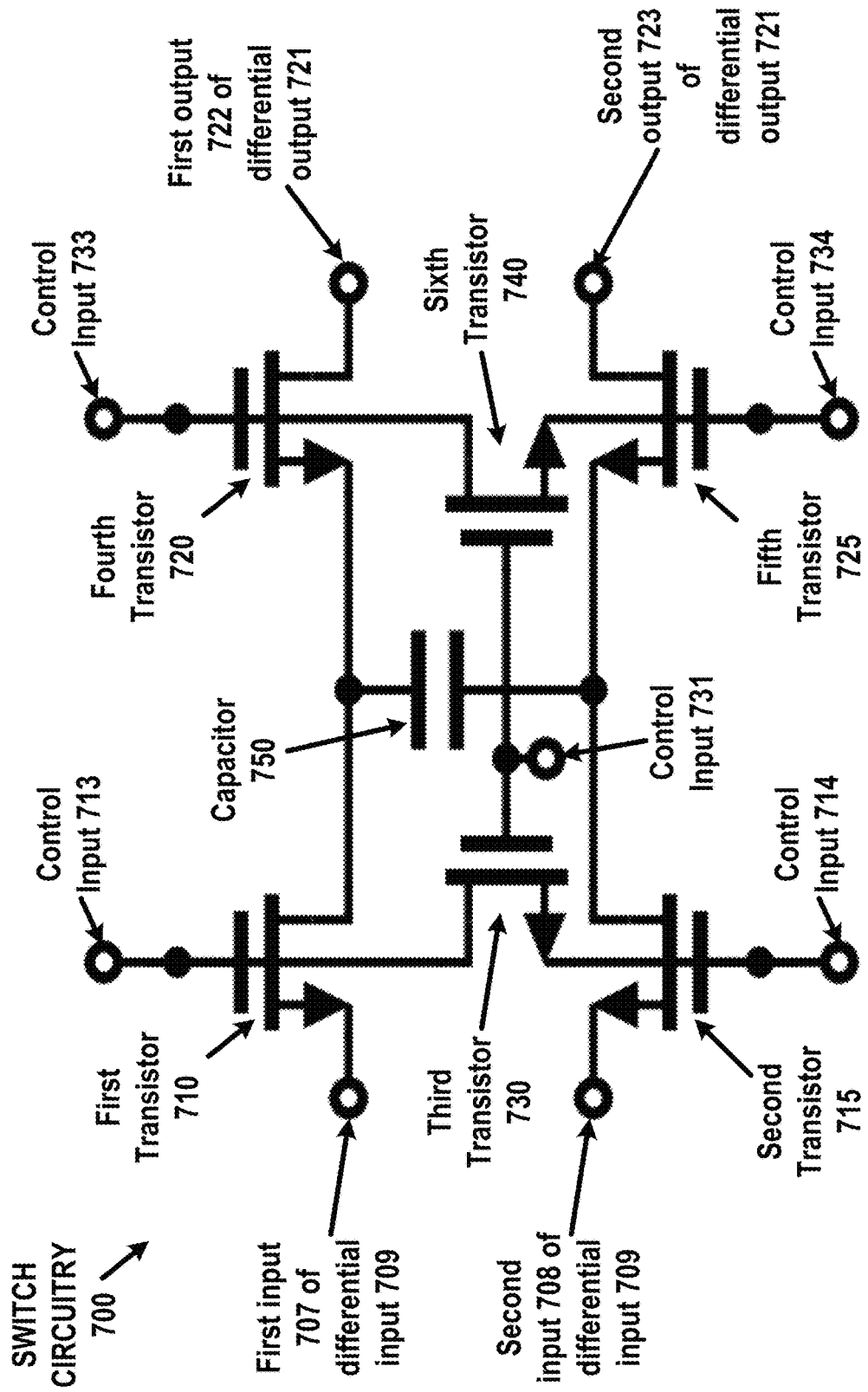
FIG. 7A is a schematic of an implementation of a differential t-switch in accordance with some examples described herein.
Figure 7B:
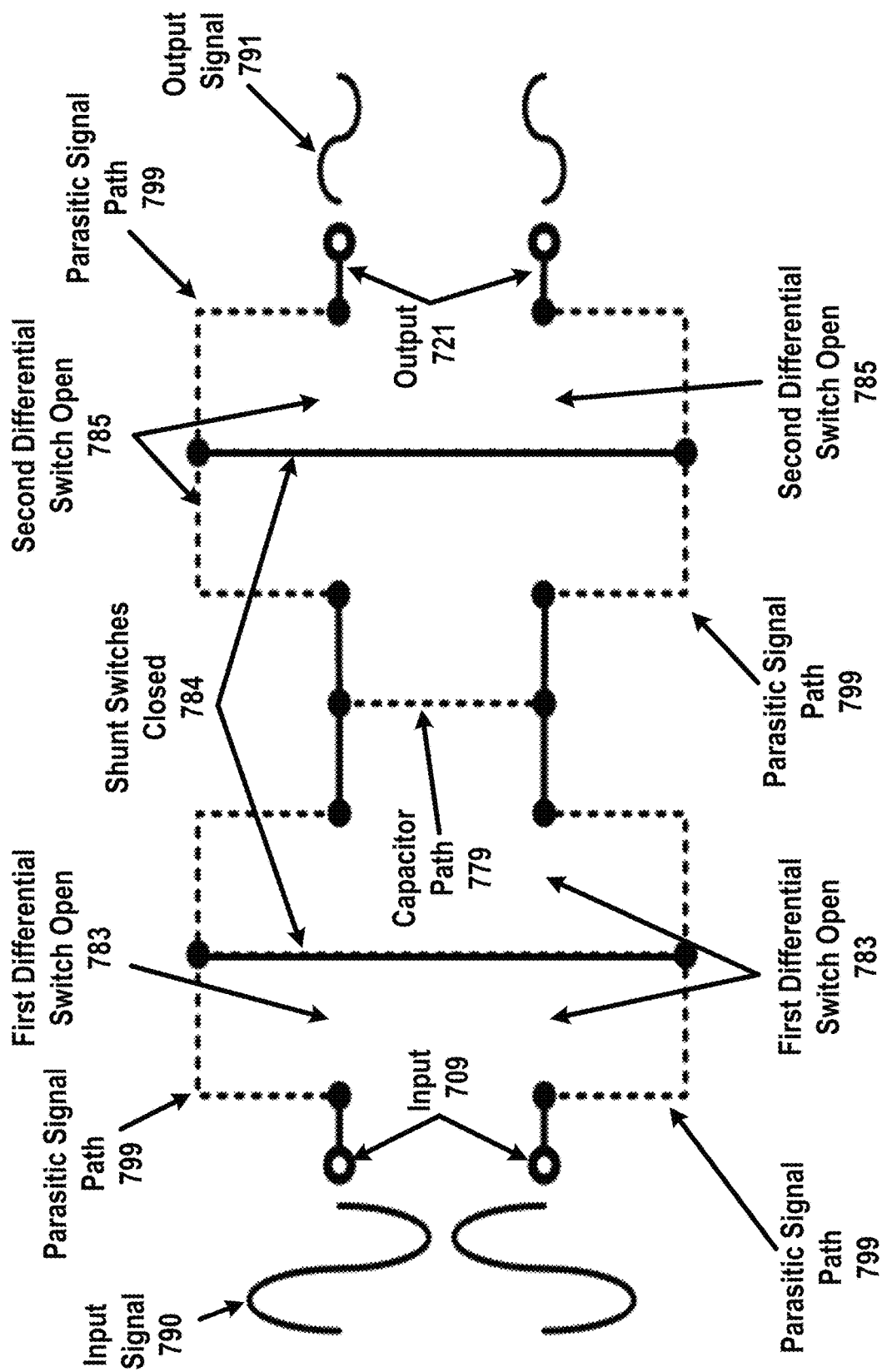
FIG. 7B is a functional diagram of a differential t-switch in a first control setting in accordance with some examples described herein.
Figure 7C:
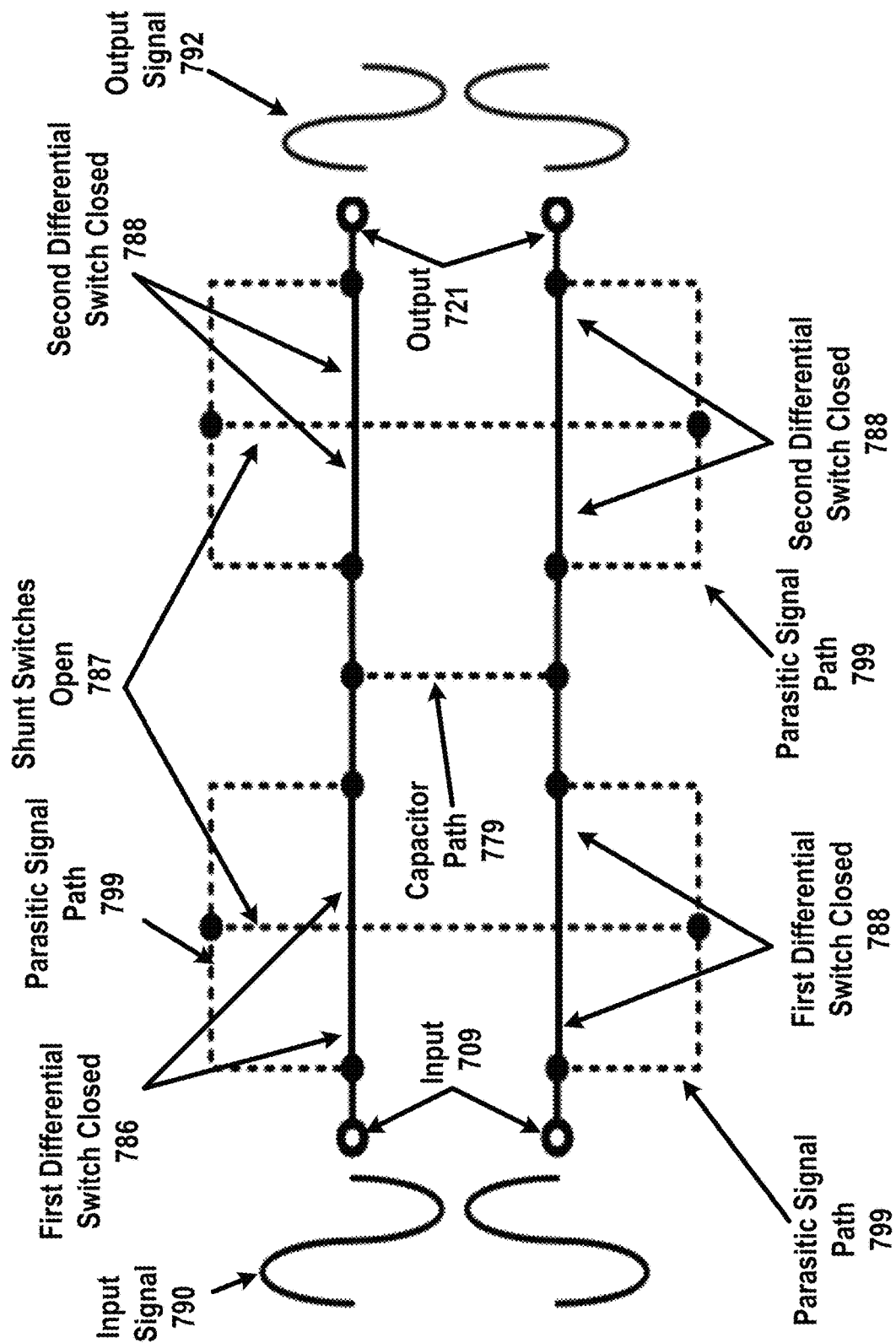
FIG. 7C is a functional diagram of a differential t-switch operating under a second control setting in accordance with some examples described herein.

The second receive path 451 is shown as a mirror of the first receive path 401 with the shared mixer 490. As described above, the switching and particular element characteristics may be different than the circuit element characteristics of the circuit elements of the first receive path 401 in order to configure the receive path to handle a specific signal for a particular band or some communication protocol. As shown, the second receive path 451 includes a receiver input 452, circuitry 454, an amplifier 456, switching circuitry 458, transformer 460, and capacitor circuitry 462 that operates similar to the corresponding elements of the first receive path 401 described above. The switch circuitry 600-2 includes a separate implementation of a t-switch to connect or isolate the second receive path 451 to the mixer 490 as a complement to the switch circuitry 600-1. FIG. 6 and FIG. 7A illustrate details of t-switches that can be used for the switch circuitry 600-1 and the switch circuitry 600-2. FIG. 7B and FIG. 7C illustrate the operation of switches (e.g., the switch circuitry 600-1 and the switch circuitry 600-2) to connect or isolate a path (e.g., to connect or isolate path 401 or path 451 from connections to the mixer 490).

FIG. 6 is a block diagram of switch circuitry 600. As shown, the switch circuitry 600 is a split differential t-switch in accordance with some examples described herein. In some implementations of the receive paths 401 and 451 of FIG. 5, each instance of the switch circuitry 600-1 and the switch circuitry 600-2 is a copy of the switch circuitry 600 of FIG. 6. In other examples, particular implementations of switch circuitry (e.g., specific transistors, circuit elements with specific design values, etc.) can be used as implementations of a t-switch in different apparatuses. In the t-switch block diagram of the switch circuitry 600 shown in FIG. 6, the first differential switch 610 and the second differential switch 620 can be considered as a double switch or a split switch, with switch 610 forming the top left and switch 620 forming the top right sides of the t structure. First shunt capacitor 650 forms the base of the t structure.

The first differential switch 610 has a first differential input 609, a first differential output 611, and a control input 614. The first differential input 609 has a first input 607 and a second input 608. The first differential output 611 has a first output 612 and a second output 613. Similarly, second differential switch 620 has a second differential input 619, a second differential output 621, and a control input 624. The second differential input 619 has a first input 617 and a second input 618, and the second differential output 621 has a first output 622 and a second output 623. The first differential input 609 functions as an input to the t-switch circuitry 600, and the second differential output 621 functions as the output of the switch circuitry 600. Between the two differential switches 610 and 620, which can also be considered as two sides of a split switch, the first differential output 611 is coupled to the second differential input 619. The connection is structured with the matching first output 612 of the first differential output 611 coupled to the first input 617 of the second differential input 619. Similarly, the second output 613 of the first differential output 611 is coupled to the second input 618 of the second differential input 619.

Control input 614 and control input 624 provide control signals to the first differential switch 610 and the second differential switch 620 to place the switch circuitry 600 in an open or a closed position. These control inputs 614 and 624, and any additional control inputs described herein, can receive signals from control circuitry. The control circuitry can be part of a microprocessor 1212 or any other such processing circuitry of an electronic device 1202 as described below or any similar device with processing circuitry configured to send control signals to switch circuitry. In the closed position, the switch circuitry 600 is designed to pass a signal from the first differential input 609 to the second differential output 621. In an open position, the switch circuitry 600 is designed to stop any signal at the first differential input 609 from passing out of the second differential output 621 (e.g., to isolate the input 609 from the output 621). Part of the isolation is from the individual differential switches providing isolation, so that the first differential switch 610 attempts to isolate the first differential input 609 from the first differential output 611 when an open signal is received at the control input 614. The second differential switch 620 isolates the second differential input 619 from the second differential output 621. When the isolation is effective, chaining multiple switches together can increase the overall isolation.

In some physical implementations of a differential switch, the physical structure and characteristics change based on the frequency of signals handled by the switch. As described in more detail below, parasitic capacitances that are an inherent part of the physical construction of elements of some differential switches can decrease the effectiveness of a switch at higher frequencies. In such implementations, the first differential switch 610 and the second differential switch 620 operating alone without the capacitor 650, the first shunt switch 630, and the second shunt switch 640 can provide effective isolation at lower frequencies. In some implementations, the first differential switch 610 and the second differential switch operating alone cannot provide effective isolation at higher frequencies. In some apparatuses, such as the receive circuit 400, a differential switch implementation, even for higher frequency receiver paths, may be necessitated by cost, size, or other implementation factors.

To address the above described problem a shunt capacitor 650 can be added as part of the switch circuitry 600 to increase the isolation between the first differential input 609 and the second differential output 621, even when the isolation between the inputs and outputs of the individual differential switches 610 and 620 is insufficient. In addition, in certain aspects, a first shunt switch and a second shunt switch 640 may be provided to further increase the isolation between the first differential input 609 and the second differential output 621.

The first shunt switch 630 has an input 631, an output 632, and a control input 633. The second shunt switch 640 has an input 641, an output 642, and a control input 643. The shunt switch 630 is coupled across the differential control input 614 to the differential switch 610. The shunt switch 640 is coupled across the control input 624 to differential switch 620. As described below, the shunt switch 630 and the shunt switch 640 take a signal leaking across control inputs (e.g. at gates of transistors as described below) and shunts the leaking signal, increasing isolation between paths. In some examples, the complete structure of the switch circuitry 600 can then be described as follows.

The switch circuitry 600 can be considered a wireless communication apparatus with a first differential switch 610 having a first differential input 609, a first differential output 611, and a first control input 614.

The switch circuitry 600 also includes a second differential switch 620 having a second differential input 619 connected to the first differential output 611, a second differential output 621, and a second control input 624.

The switch circuitry 600 includes a shunt capacitor 650 coupled between a first output 612 of the first differential output 611 and a second output 613 of the first differential output 611. Similarly, the shunt capacitor 650 is coupled between a first input 617 of the second differential input 619 and a second input 618 of the second differential input 619.

The switch circuitry 600 includes a first shunt switch 630 having a third control input 633, a third input 631, and a third output 632. The third input 631 and the third output 632 are coupled across control input 614 of differential switch 610.

The switch circuitry 600 also includes a second shunt switch 640 having a fourth control input 643, a fourth input 641, and a fourth output 642. The fourth input 641 and the fourth output 642 are coupled across control input 624 of differential switch 620.

During operation, first differential input 609 can receive a signal from other parts of a receive path (e.g., from a transformer such as the transformers 410 or 460), and the second differential output 621 can be coupled to a mixer (e.g., the mixer 490) or other such receive path elements. The switch circuitry 600 operates to connect or isolate the signals along the receive path that a particular implementation of switch circuitry (e.g., the switch circuitry 600-1 and 600-2) is part of. In each implementation of switch circuitry 600, control input 633 is used to set the first shunt switch 630 to an open setting and the control input 643 is used to set the second shunt switch 640 to an open setting when the first and second differential switches 610 and 620 are set to a closed setting. Conversely, the various control inputs are used to set the first shunt switch 630 and the first shunt switch 640 to closed settings when first differential switch 610 and second differential switch 620 are set to open settings. At higher frequencies, the leakage signal from the first input 607 of the first differential input 609 to the first output 612 of the first differential output 611 is accessible at a first input of control input 614. Similarly, the leakage signal from the second input 608 of the input 609 to the second output 613 of the output 611 is accessible at a second input of control input 614. The shunt switch 630 can connect the two sides of the leaking differential signal to have these signals largely cancel each other out. The same operation can be used to cancel any remaining leakage current that remains at the control input 624 of the differential switch 620 using the shunt switch 640. The shunt capacitor 650 and the shunt switches 630 and 640 operate to increase the isolation of the switch circuitry 600 by having the signal on the two sides of the first differential switch 610 cancel each other out when the shunt switches 630 and 640 are set for closed switch operation. As described above, the physical characteristics of the material used to implement the switch circuitry 600 can result in physical isolation that is less effective due to parasitic electrical effects. By canceling the signals, including any signals transmitted via parasitic electrical elements, the isolation can be increased signification.

Additionally, for certain implementations where the switch circuitry 600 is implemented in surrounding circuitry with other capacitor circuitry, the capacitor 650 can be designed (e.g., provided with a particular capacitance value) in conjunction with capacitor circuitry between the first differential input 609 and a transformer (e.g., the capacitor circuitry 412 and the transformer 410 or the capacitor circuitry 462 and the transformer 460) for efficient implementations of the switch circuitry 600 in a given receive path. The efficiency is because the capacitor 650 is in parallel with the previous capacitor circuitry in the same receive path. The structure of the switch circuitry 600 allows the capacitor 650 to have a dual function of improving isolation as a shunt circuit with the switch circuitry 600 is configured for isolation, and complementing the capacitor circuitry 462 when the switch circuitry 600 is configured to pass a signal. In some examples, a size of capacitor circuitry in a receive path (e.g., the capacitor circuitry 412 or 462) can thus be decreased by a same or similar amount of a size of capacitor 650, making efficient use of space in an apparatus including the switch circuitry 600 and improving the isolation performance of a receive channel that includes the switch circuitry 600.

The above-described structure of the switch circuitry 600 improves the isolation performance over direct (e.g., double or multiple) switches without the combination shunt, which can result in only a few dB of isolation at high frequencies of signal harmonics, while balancing the trade-off between loss and isolation of the switch which ultimately limits isolation, such as at higher frequencies. The capacitor 650 works in combination with the shunt switches to improve isolation and address reliability concerns with the shunt switches. Particularly for a differential embodiment, a differential swing might exceed an allowed range, and the inclusion of the capacitor 650 can addresses design concerns with the differential swing exceeding the allowed range. Further, the capacitor 650 solves the reliability issue in a way that high Vt devices do not, as high Vt devices add additional parasitics and further compromises performance.

By contrast, the use of a shunt capacitor such as the capacitor 650 can be complementary to a design and incorporated as part of a tuning capacitor bank for a signal line (e.g., the capacitor circuitry 412 or 462). The shunt capacitor can also provide an additional shunt path between the two signal lines or the signal line and reference potential (e.g., a ground), to attenuate harmonics at higher frequencies with no reliability concerns associated with the differential swing described above. For various implementations, such as inclusion in a receive circuit such as the receive circuit 400, use of a t-switch as described herein can thus enable different receive path port and band sharing for downlink paths, which can reduce associated circuit area usage. The t-switch can also enable concurrency scenarios that were previously prohibited or not useful due to interference and throughput drop associated with particular receive path structures. The t-switch can thus enable flexibility for specific band and carrier aggregation combinations for a device that would otherwise have performance issues. The t-switch can additionally improve throughput of cases with marginal interference and signal degradation where throughput is reduced due to signal errors.

While as described above, the use of one or more shunt-switches can resolve reliability issues and improve performance, some examples can be implemented without shunt switches. Such an example based on FIG. 6 would include the differential switches 610 and 620 with the capacitor 650 in the same configuration, but will omit the shunt switches 630 and 640 (e.g. the input and output connections where the switches 630 and 640 would be connected are open so the only connection between the first input and second input of the differential path between the two differential switches is the capacitor 650). Such an implementation can reduce complexity and area use with a minor decrease in isolation. In implementations where the reliability is addressed elsewhere in a circuit or within an apparatus, an apparatus may be improved with such an example t-switch. A corresponding implementation without shunt switching in FIG. 7A below would exclude the transistors 730 and 740, and also eliminate the control input 731 coupled to the gates of these transistors.

FIG. 7A is a schematic diagram illustrating an example implementation of a differential t-switch, shown as switch circuitry 700, in accordance with some examples described herein. As illustrated, the switch circuitry 700 can be an implementation of the switch circuitry 600. Comparing the switch circuitry 700 to the switch circuitry 600, a first transistor 710 and a second transistor 715 correspond to the first differential switch 610. Fourth transistor 720 and fifth transistor 725 correspond to the second differential switch 620. Third transistor 730 corresponds to the first shunt switch 630, sixth transistor 740 corresponds to the second shunt switch 640, and capacitor 750 corresponds to the capacitor 650. In the implementation shown in FIG. 7A, each transistor can be implemented as an N-type metal oxide semiconductor field effect transistor (MOSFET) as shown by the included transistor graphics. In other implementations, different transistors and fabrication technologies can be used (e.g., P-type or otherwise). The transistors act as switches controlled by the signals received at the gate of each transistor.

The input to the switch circuitry 700 is the differential input 709 across the sources of the first transistor 710 and the second transistor 715 (e.g., the first input 707 of the differential input 709 is the source of the first transistor 710 and the second input 708 of the differential input 709 is the source of the second transistor 715). Similarly, the differential output 721 is across the drains of the fourth transistor 720 and the fifth transistor 725 (e.g., the first input 722 of differential output 721 is the drain of fourth transistor 720 and the second input 723 of differential output 721 is the drain of fifth transistor 725.

The above description of the switch circuitry 600 can be used to further describe the switch circuitry 700 as follows. The switch circuitry 700 is configured where the first differential switch 610 comprises a first transistor 710 and a second transistor 715. The first input 607 of the first differential input 609 comprises a source of the first transistor 710. The second input 608 of the first differential input 609 comprises a source of the second transistor 715. The first input 612 of the first differential output 611 comprises a drain of the first transistor 710. The second output 613 of the first differential output 611 comprises a drain of the second transistor 715. The first control input 614 corresponds to control inputs 713 and 714 and comprises a gate of the first transistor 710 and a gate of the second transistor 720.

The switch circuitry 600 can further be implemented with switch circuitry 700 where the first shunt switch 630 comprises a third transistor 730 having a drain coupled to the gate of the first transistor 710 and a source coupled to the gate of the second transistor 715. The second and third control input 633 and 643 corresponds to control input 731 which comprises a gate of the third transistor 730 and is coupled to a gate of the sixth transistor 740.

The switch circuitry 600 can further be implemented with switch circuitry 700 where the second differential switch 620 comprises a fourth transistor 720 and a fifth transistor 725. The first input 617 of the second differential input 619 comprises a source of the fourth transistor 720. The second input 618 of the second differential input 619 comprises a source of the fifth transistor 725. The first input 722 of the second differential output 721 comprises a drain of the fourth transistor 720. The second input 723 of the second differential output 721 comprises a drain of the fifth transistor 725. The fourth control input 624 correspond to control inputs 733 and 734, the fourth control input 633 comprises a gate of the fourth transistor 720 and a gate of the fifth transistor 725 when switch circuitry 600 is implemented as switch circuitry 700.

Switch circuitry 600 can further be implemented with the switch circuitry 700 where the second shunt switch 640 comprises a sixth transistor 740 having a drain coupled to the gate of the fourth transistor 720 and a source coupled to the gate of the fifth transistor 725. The third control input 643 then corresponds to the control input 731 as tied to the control input 633 which further comprises a gate of the sixth transistor 740.

In some examples, the control inputs 713, 714, 733, and 734 are the corresponding gates of first, second, fourth and fifth transistors 710, 715, 720, and 725. The gates of third transistor 730 and the sixth transistor 740 are tied together and connected to control input 731. As illustrated in FIG. 7B and FIG. 7C, the switch circuitry then operates with the control inputs 713, 714, 733, and 734 in an opposite signal state from the control input 731, so that the transistors 710, 715, 720, and 725 are on when the transistors 730 and 740 are off, and the transistors 710, 715, 720, and 725 are off when the transistors 730 and 740 are on. While specific examples of drain, gate, and source connections are described above, other implementations with different transistor types (e.g., p-type transistors or n-type transistors) may have different terminal connections, such that in alternate aspects, the source or drain (e.g., terminal) connections described above can be adjusted to achieve the same functionality corresponding to the particular transistor type.

FIG. 7B is a functional diagram of a differential t-switch in a first control setting in accordance with some examples described herein. In the first control setting shown in FIG. 7B, the switch circuitry 700 is configured for an open setting (e.g., to minimize an output signal 791 transmitted to the output 721 from the input 709 when the input signal 790 is present). In the first control setting, the first differential switch is in an open setting 783 and the second differential switch is in an open setting 785, while the shunt switches are in a closed state 784. The first differential switch open setting 783 corresponds to an off voltage for the transistors 710 and 715 at the control inputs 713 and 714. The second differential switch open setting 785 corresponds to an off voltage for the transistors 720 and 725 at the control inputs 733 and 734. The shunt switches closed state 784 corresponds to an on setting at the control input 731 which is tied to the gates of both of the transistor 730 and 740.

As described herein "high frequencies" refer to frequencies at which parasitic signal paths carry a signal sufficient to interfere with device operation (e.g., frequencies where parasitic effects are large or impact device functionality). In some examples, the threshold for high frequencies can occur when an output signal across parasitic signal paths in a switch when the switch is in an open position is more than a threshold value, or when the signal transmitted across parasitic signal paths when the switch is in an open position is more than a threshold percentage or a threshold fraction of the signal that is transmitted across non-parasitic paths when the switch is in a closed position. Similarly, low frequencies as described herein are frequencies where parasitic signal paths have a small impact on device operation. High and low frequencies as described herein are thus device specific based on the characteristics of elements in a device, and particularly, the parasitic values for given elements arranged in a specific device. For low frequencies (e.g., frequencies where parasitic effects are small relative to circuit elements), the input signal 790 is isolated by the differential switches being open. At high frequencies (e.g., once parasitic values become substantial due to circuit characteristics at given frequencies for physical capacitor performance), however, parasitic capacitances across the transistors 710, 715, 720, and 725 (e.g. the parasitic signal path 799) allow significant amounts of the high frequency input signal 790 be pass through the switch circuitry 700 to create a large output signal 791 where isolation increases performance. By including both the closed path for the shunt switches in the shunt switch closed setting, the high frequency signal in the parasitic capacitances is directed across the differential path so the signal is largely canceled out across the three shunt paths, rather than transmitted as part of the output signal 791. Any signal along the parasitic signal path 799 is reduced at the gates of the first switch and the second switch when the shunt switches are in the closed state 784, significantly reducing leakage. The added shunt paths result in significant isolation even for high frequencies, with a corresponding low magnitude of the output signal 791 (e.g., which ideally is 0 for complete isolation). For a single ended embodiment, the parasitic signal path is attached from the gates of transistors to a reference potential (e.g., a ground), providing a similar signal cancelation for the corresponding parasitic signal path.

FIG. 7C is a functional diagram of a differential t-switch operating under a second control setting in accordance with some examples described herein. In the second control setting shown in FIG. 7C, the switch circuitry 700 is configured for closed setting (e.g., to pass an input signal 790 as an output signal 792 from the input 709 to the output 721). In the second control setting, the first differential switch is in a closed setting 786, and the second differential switch is in a closed setting 788, while the shunt switches are in an open setting 787. The first differential switch closed setting 786 corresponds to an on voltage for the transistors 710 and 715 at the control inputs 713 and 714. The second differential switch closed setting 788 corresponds to an on voltage for the transistors 720 and 725 at the control inputs 733 and 734. The shunt switches closed setting corresponds to an offsetting at control input 731 which is tied to the gates of both the transistor 730 and the transistor 740. The capacitor path 779 and parasitic capacitances across the shunt switches when the shunt switches are in the open setting can sometimes have an impact on the input signal 790. The impact can influence operation so that the output signal 792 is not the same as if the input signal 790 was transmitted across a close transmission line in certain scenarios. Implementations that use the switch circuitry 700 (e.g., as an implementation of the receive circuit 400) can account for (e.g., compensate for) any decrease in signal quality due to the switch circuitry 700. Similarly, any associated signal quality decrease at the output signal 792 can be more than offset by increased isolation to improve signal quality along other receive paths due to the improved isolation when the switch circuitry 700 is operating in the first control setting as described above in FIG. 7B.

The switch circuitry 600 and the switch circuitry 700 can be implemented as a stand-alone a wireless apparatus or can be implemented in the context of a larger wireless apparatus to improve device performance by increasing isolation between signal paths (e.g., receive paths). In some implementations, a t-switch (e.g., the switch circuitry 600 or 700) including elements such as the first differential switch 610, the second differential switch 620, the shunt capacitor 650, the first shunt switch 630, and the second shunt switch 640 of FIG. 6, or the corresponding transitory elements of FIG. 7A are part of a first receive path of a receive switch matrix (RxSM). In other examples, these can be part of a system on a chip (SoC) transceiver, a transceiver unit with transmit and receive paths, an RF front-end module, a cell phone with a touch screen, a wireless device with an antenna, or any other such device. Some such apparatuses can, in addition to the t-switch circuitry elements described above, include a mixer (e.g., of an RxSM) coupled to the second differential output 621 of the second differential switch 620 or the output 721. Such an apparatus can further include a second receive path (e.g., of the RxSM), where the second differential output of the second differential switch is coupled to an output of the second receive path, and where the first receive path further comprises a low-noise amplifier (LNA) having an output coupled to a first differential input such as the input 609 or the input 709.

Some such examples can further include a transformer having a transformer differential output coupled to the first differential input such as the input 609 or the input 709, similar to the systems described above in FIG. 3 through FIG. 5. Some such examples can further include a capacitor bank such as the capacitor circuitry 412 or the capacitor circuitry 462 coupled across the transformer differential output (e.g., and the input such as the input 609 or the input 709 of the switch circuitry).

Various such examples can include a plurality of receive paths reconfigurable to support a plurality of communication bands for a plurality of communication protocols or standards, where the first receive path can be isolated from a second receive path of the plurality of receive paths using the split differential t-switch.

The switch circuitry can be operated as described above, with control circuitry coupled to the described control inputs. In one example, the control circuitry is configured to deselect the first control input and the second control input while selecting the third control input and the fourth control input to open the first differential switch 610 and the second differential switch 620 while closing the first shunt switch 630 and the second shunt switch 640 to isolate the first differential input 609 from the second differential output 621. In some such examples, the control circuitry is configured to select the first control input 614 and the second control input 624 while deselecting the third control input 633 and the fourth control input 643 to close the first differential switch and the second differential switch while opening the first shunt switch and the second shunt switch to couple the first differential input 609 to the second differential output 621.

Figure 8:
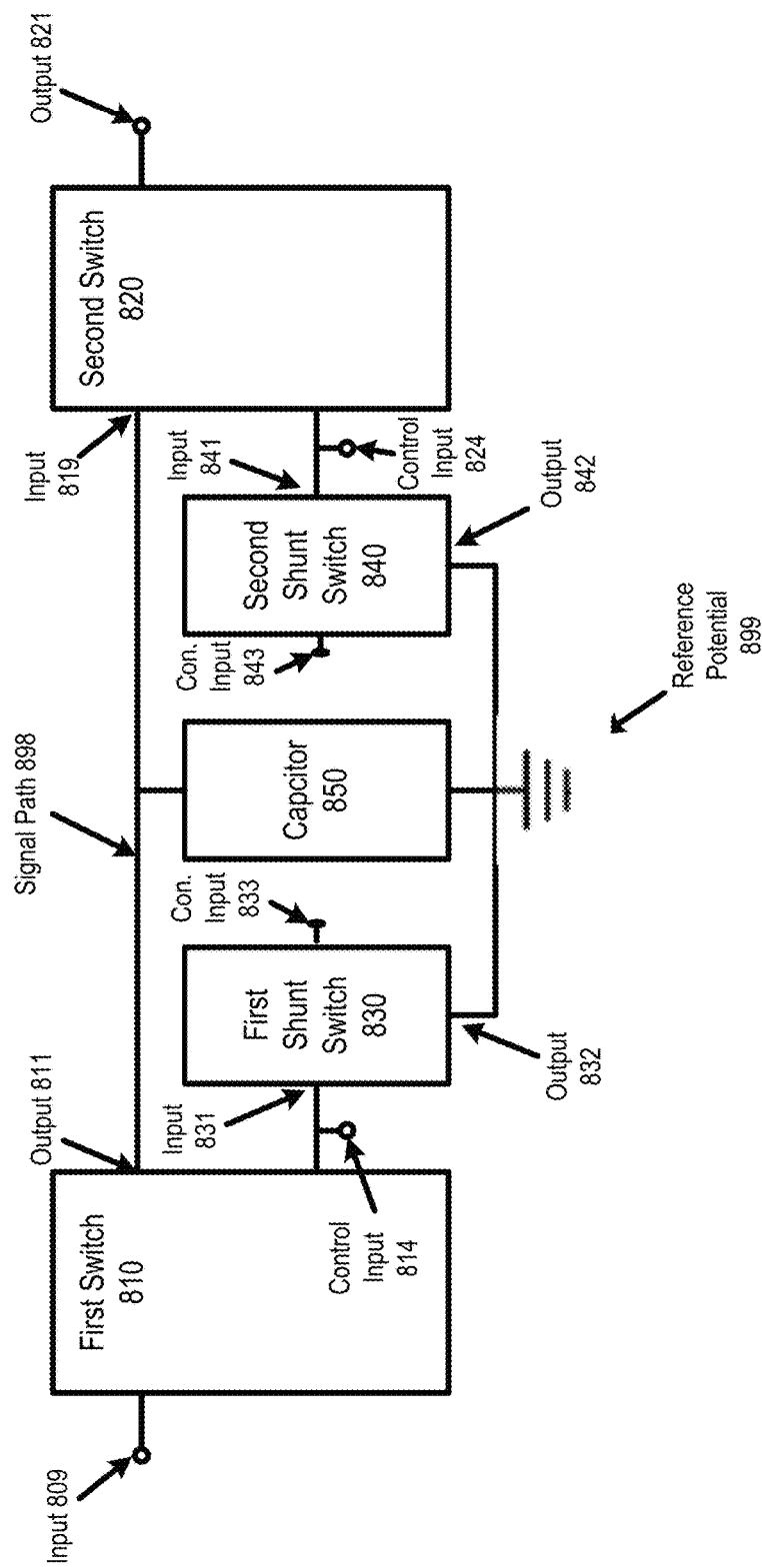
FIG. 8 is a block diagram of a single-ended t-switch in accordance with some examples described herein.
Figure 9:
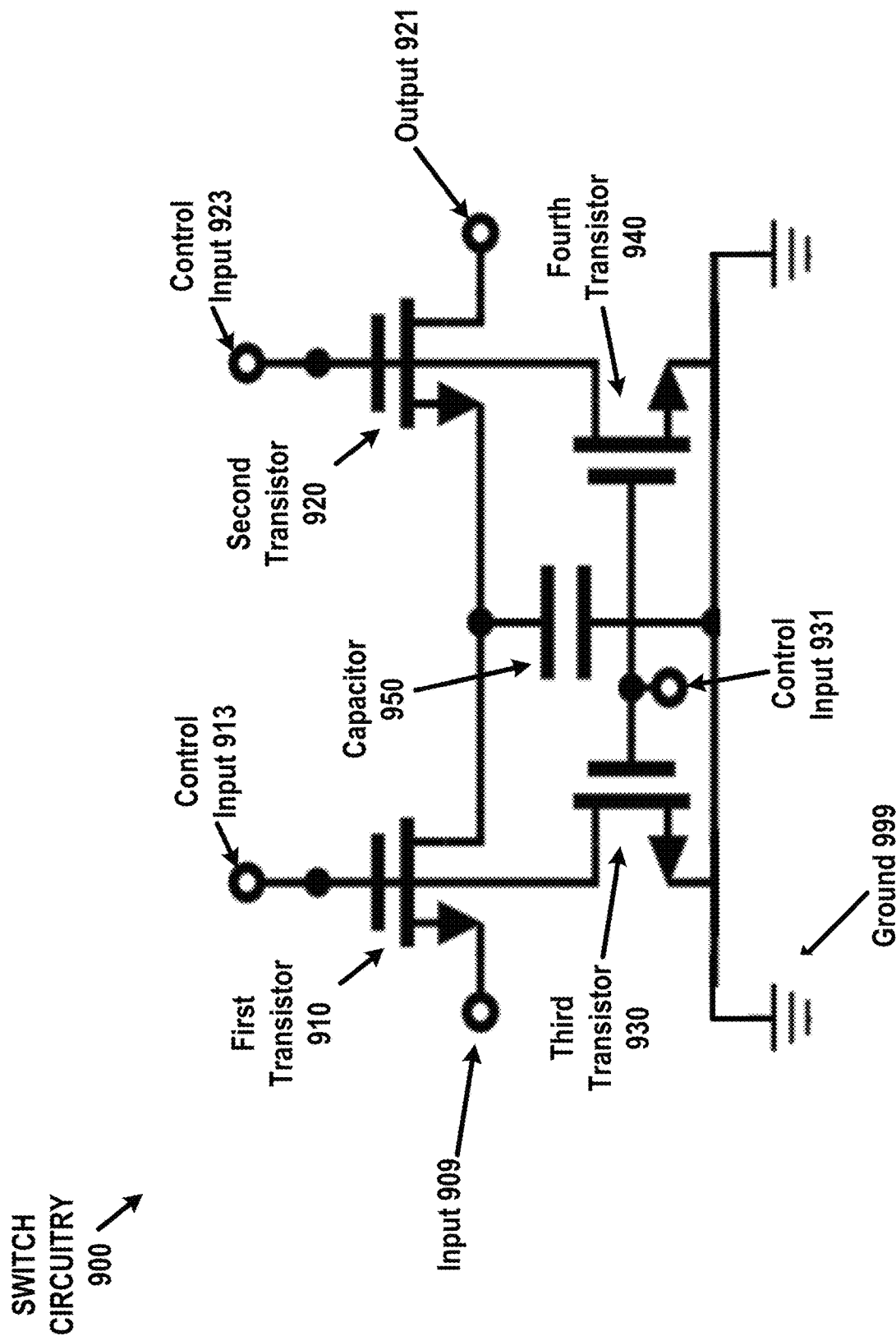
FIG. 9 is a schematic of an implementation of a single-ended t-switch in accordance with some examples described herein.

As described above, a transformer, such as the transformer 410 and/or the transformer 460, as well as other transformers of an RxSM can be used to implement single-ended portions of a receive paths separated from differential portions of a receive path by a transformer. In some examples, rather than using a differential portion of a receive path, single ended portions of a receive path may have isolation issues as described above (e.g., the switch circuitry 408 and 458 or receive paths without a differential portion). In such paths, a single ended version of the switch circuitry described above can be implemented. FIG. 8 and FIG. 9 below describe single ended versions of the switch circuitry 600 and 700, where a reference potential (e.g., a ground) plane is present with the signal path instead of a differential signal path.

In some aspects, the structures described above can be used with a single shunt switch or with no shunt switches. Such examples can be used when capacitor 650 or capacitor 650 with one of the illustrated shunt switches (e.g., either switch 630 or switch 640) provides sufficient isolation across the switch circuitry 600 (e.g., between first differential input 608 and second differential output 621). One such aspect is an apparatus comprising a first differential switch having a first and a second input, a first and a second output, and a control input; a second differential switch having a first and second input coupled to the respective first and second output of the first differential switch, the second differential switch further having a first and second output, and a control input; and a shunt capacitor coupled between the first output and the second output of the first differential switch, the shunt capacitor further coupled between the first input and the second input of the second differential switch. Additional such aspects can have a single shunt switch positioned either at the first differential switch or the second differential switch to improve isolation when the apparatus is configured to an open setting. Another such aspect can be the switch circuitry 700 of FIG. 7, but with either third transistor, sixth transistor 740, or both removed to create a structure with less isolation, but less area and power usage due to the fewer numbers of transistors.

FIG. 8 is a block diagram of a single-ended t-switch in accordance with some examples described herein, shown as switch circuitry 800. In the switch circuitry 800, the second input of the differential signal path (e.g., the second input 608 of the input 609 and the second output 623 of the second output 621) are replaced by a reference potential 899. The reference potential 899 can be a ground potential, or any other such reference potential. The transmission path for switch circuitry 800 begins at the input 809, travels between the first switch 810 and the second switch 820 on the path from the output 811 to the input 819, and ends at the output 821, where the path will connect to other circuitry depending on the particular implementation. Just as above with the differential embodiment, the first switch 810 is controlled by a control input 814 and the second switch 820 is controlled by a control input 824. Due to parasitic capacitances that limit isolation at higher frequencies, the shunt capacitor 850, the shunt switch 830, and the shunt switch 840 are included across the signal path 898 to the reference potential 899. The shunt switch 830 connects to the signal path 898 at the input 831 and to the reference potential at the output 832 while an operational setting is managed by a voltage at the control input 833. The shunt switch 840 connects to the signal path 898 at the input 841 and to the reference potential at the output 842 while an operational setting is managed by a voltage at the control input 843. Just as with the differential implementation, the first switch 810 and the second switch 820 are open when the first shunt switch and the second shunt switch 840 are closed as part of an open control setting of the circuitry 800 to isolate the output 821 from the input 809. The first switch 810 and the second switch 820 are closed when the first shunt switch and the second shunt switch 840 are open as part of a second control setting of the circuitry 800 to provide a transmission path for a signal between the input 809 and the output 821 in the second closed control setting.

Just as described above for the differential examples of FIGS. 6 and 7, some implementations of the single-ended t-switch can exclude the use of shunt switches. Such an example will simply remove the shunt switches 830 and 840 leaving the connections between the corresponding inputs and outputs open. The corresponding implementation for FIG. 9 would exclude the third transistor 930, the fourth transistor 940, and the control input 931. As described above, the FIG. 9 implementation can reduce size and complexity of switch circuitry, with minor reductions in isolation and possible reliability issues that can otherwise be addressed within some apparatus designs.

FIG. 9 is a schematic of an implementation of a single-ended t-switch in accordance with some examples described herein. Circuitry 900 is an implementation of the switch circuitry 800, with the first switch 810 implemented with the first transistor 910, the second switch 820 implemented with the second transistor 920, the first shunt switch 830 implemented with the third transistor 930, and the second shunt switch 840 implemented with the fourth transistor 940. In the circuitry 900, the source of the first transistor 910 is the input 909, the gate of the first transistor is the control input 913, and the drain of the first transistor 920 is coupled to the source of the second transistor 920. The gate of the second transistor is the control input 923, and the drain of the second transistor 920 is the output 921. One end of the capacitor 950 is coupled to the drain of the first transistor 910 and the source of the second transistor 920, while the other end of capacitor 950 is coupled to the reference potential 999. A drain of the third transistor 930 is coupled to the gate of the first transistor 910 and a source of the third transistor 930 is coupled to the reference potential 999. Similarly, the drain of the fourth transistor 940 is coupled to the gate of the second transistor 920 transistor and a source of the fourth transistor 940 is coupled to the reference potential 999. The gates of third transistor 930 and fourth transistor 940 are coupled together and connected to the control input 931.

When the switch circuitry 900 is configured by control circuitry to pass a signal from the input 909 to the output 921, voltages at the control inputs 913 and 923 are set to turn the first transistor 910 and the second transistor 920 to an on state (e.g., on), while voltages at the control input 931 are set to turn the third transistor 930 and fourth transistor 940 to an off state (e.g., off). Such switch configurations create the signal path from the input 909 to the output 921 to pass the signal along a receive path.

When the switch circuitry 900 is configured by control circuitry to isolate the output 921 from the input 909, voltages at the control inputs 913 and 923 are set to turn the first transistor 910 and the second transistor 920 off, while voltages at the control input 931 are set to turn the third transistor 930 and the fourth transistor 940 on. Such settings impede the signal along the signal path, but as described above, at high frequencies, parasitic capacitances of the first transistor 910 and the second transistor 920 can still leak significant signal from the input 909 to the output 921 in the absence of additional circuitry. The capacitor 950 combined with the third transistor 930 and the fourth transistor 940 being turned on cancels the signal leaking through the first transistors 910 and 920 by directing significant portions of the signal to the reference potential 999 and causing portions of the leakage signals to cancel each other out. For high frequencies, the signal cancelation significantly increases the isolation at the output 921 compared to a circuit without the shunt transistors 930 and 940 or capacitor 950. While the added circuitry may degrade the performance in the closed position, the degradation can be accounted for in the circuit design, and is compensated for by the reduced leakage of signals into other receive paths.

In some aspects, the structures described above can also be used with a single shunt switch or with no shunt switches, just as described for the differential aspects above. One such aspect is an apparatus comprising a first switch similar to switch 810 connected to a second switch similar to switch 820, with a capacitor coupling a signal path between the two switches to a reference potential. In such an aspect, either first shunt switch 830, second shunt switch 840, or both are not present. Another such aspect can be similar to switch circuitry 900 of FIG. 9, but with either third transistor 930, fourth transistor 940, or both not present in the structure.

Figure 10:
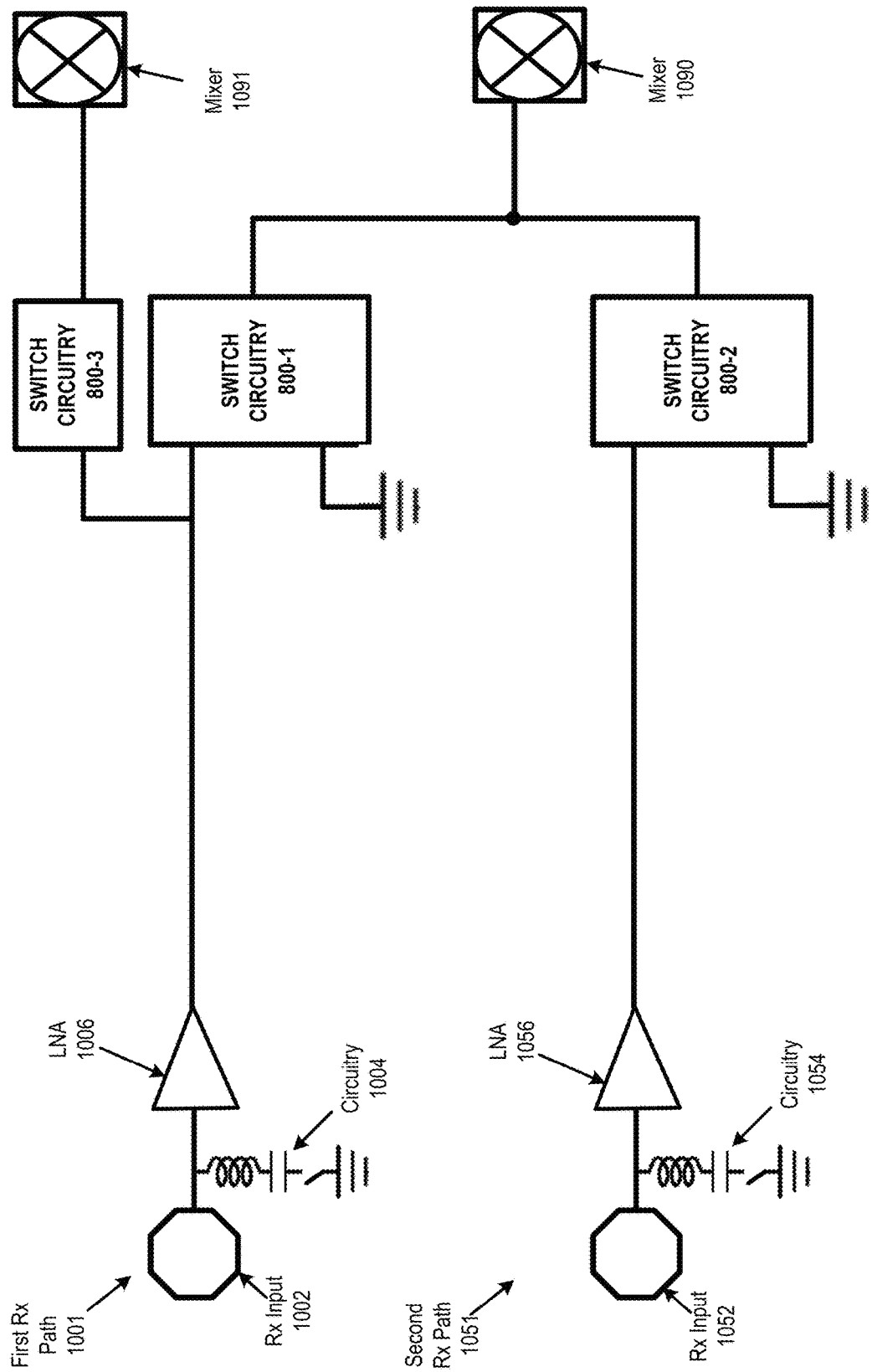
FIG. 10 is a diagram of two receive paths coupled to a single mixer that can include implementations of a single ended t-switch in accordance with examples described herein.

FIG. 10 is a diagram illustrating two receive paths coupled to a single mixer that can include implementations of a single ended implementation of the t-switch. The first receive path 1001 includes a receive input 1002 that receives a signal from an antenna (e.g., the antenna 130 or any other such antenna). In some examples, the circuitry 1004 is signal conditioning circuitry (e.g., and could include filters and other circuitry), and the signal from the receive input 1002 is then input to the low-noise amplifier 1006. In some examples, some switching can be included before an amplifier. The switch circuitry 800-1 is an implementation of a t-switch as detailed above in FIG. 8, which can also be implemented as the circuitry 900 of FIG. 9 (e.g., single ended t-switch examples). The switch circuitry 800-1 either connects a received signal to the mixer 1090 or isolates the first receive path 1001 from the mixer 1090, depending on a control input setting for the switch circuitry 800-1. Similarly, as shown with mixer 1091, the switch circuitry 800-1 can be used with the switch circuitry 800-3 to direct a received signal to either the mixer 1090 or the mixer 1091. Just as described above, in a receive circuit such as the receive circuit 400, different combinations of implementations of a t-switch can be used both as part of improved isolation and direction of a received signal along a selected branch (e.g. between the mixer 1091 and the mixer 1090) as part of a receive path. Receive paths in the receive circuit 400 can include multiple instances of split t-switches for routing signals between mixers in different arrangements, including routing signals from a single path to different mixers and routing signals from multiple paths to one mixer, while isolating other paths to reduce interference with the selected signal.

The second receive path 1051 is shown as a mirror of the first receive path 1001 with the shared mixer 1090. In other examples, the receive path 1051 can optionally also be connected to one or more additional separate mixers in addition to the illustrated the mixer 1090, As described above, the switching and particular element characteristics may be different than the circuit element characteristics of the circuit elements of first receive path 401 in order to configure the receive path to handle a specific signal for a specific band or RF signal type. As shown, the second receive path 1051 includes a receiver input 1052, circuitry 1054, and an amplifier 1056 that operates similar to the corresponding elements of the first receive path 1001 described above. The switch circuitry 800-2 then includes a separate implementation of a t-switch to connect or isolate the second receive path 1051 to mixer 1090 as a complement to the switch circuitry 800-1. FIG. 8 and FIG. 9 illustrate details of t-switches that can be used for the switch circuitry 800-1, 800-3 and 800-2.

Figure 11A:
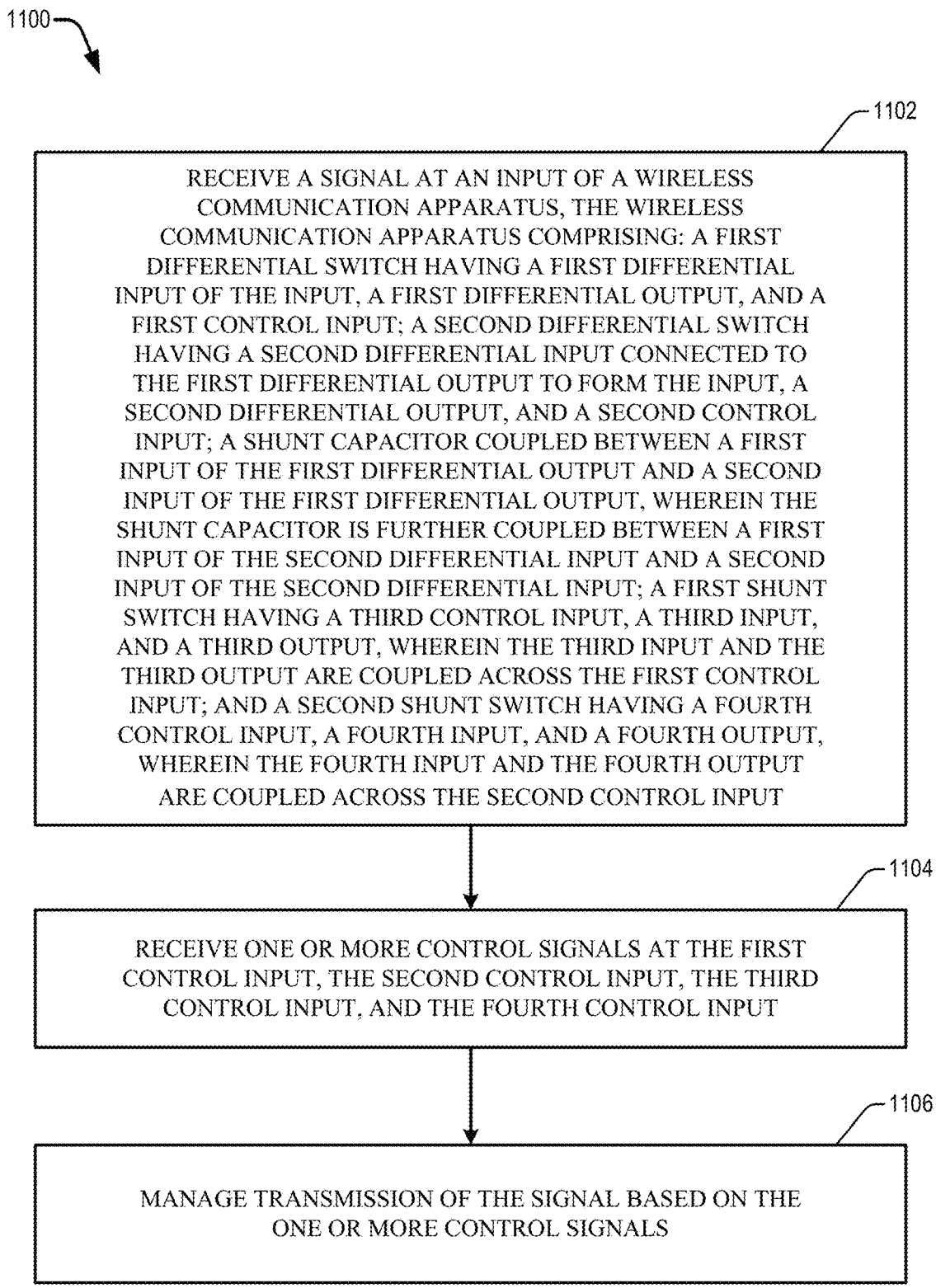
FIG. 11A is a flowchart illustrating a method in accordance with examples described herein.

FIG. 11A is a flow chart illustrating an example of a method 1100 for switching, directing, or otherwise routing a signal in a wireless communication apparatus or device. The method 1100 is described in the form of a set of blocks that specify operations that can be performed. However, operations are not necessarily limited to the order shown in FIG. 11A or described herein, for the operations may be implemented in alternative orders or in fully or partially overlapping manners. Also, more, fewer, and/or different operations may be implemented to perform the method 1100, or an alternative approach.

At block 1102, the method 1100 includes operations to receive a signal at an input of a wireless communication apparatus, the wireless communication apparatus comprising: a first differential switch having a first differential input of the input, a first differential output, and a first control input; a second differential switch having a second differential input connected to the first differential output to form the input, a second differential output, and a second control input; a shunt capacitor coupled between a first input of the first differential output and a second input of the first differential output, where the shunt capacitor is further coupled between a first input of the second differential input and a second input of the second differential input; a first shunt switch having a third control input, a third input, and a third output, where the third input and the third output are coupled across the first control input; and a second shunt switch having a fourth control input, a fourth input, and a fourth output, where the fourth input and the fourth output are coupled across the second control input.

At block 1104, the method 1100 includes operations to receive one or more control signals at the first control input, the second control input, the third control input, and the fourth control input.

At block 1106, the method 1100 includes operations to manage transmission and/or isolation of the signal based on the one or more control signals. As described above, managing transmission can involve configuring circuit elements of a t-switch such that switch elements are closed and shunt elements are open, and managing isolation can involve configuring circuit elements of the t-switch such that shunt elements are closed and switch elements are open. In some examples, where multiple switches are used to manage multiple paths, one split-t switch can be configured to isolate a first signal from a second path, while a second split-t switch can be configured to transmit another signal on the second path. In other implementations, any such configurations, settings, and operations to manage signals, including configurations with multiple signal paths, multiple switches, additional elements, or other such configurations, can be used in accordance with or in addition to the described operations of method 1100.

FIG. 11B is a flow chart illustrating an example of a method 1150 for switching, directing, or otherwise routing a signal in a wireless communication apparatus or device. The method 1150 is described in the form of a set of blocks that specify operations that can be performed. However, operations are not necessarily limited to the order shown in FIG. 11B or described herein, for the operations may be implemented in alternative orders or in fully or partially overlapping manners. Also, more, fewer, and/or different operations may be implemented to perform the method 1150, or an alternative approach.

At block 1152, the method 1150 includes controlling switching circuitry of a circuit in a first mode to isolate an input of the switching circuitry from an output of the switching circuitry. The control can be performed with first control signals from control circuitry of a device such as processor 108 of electronic device 102 or microprocessor 1212 of electronic device 1202, or any other such control circuitry in electronic device 1202 or 102. The first control signals are configured to select an open configuration for a first switch and an open configuration for a second switch. In some aspects, the first switch has an input, an output, and a control input for the first control signals, and the second switch has an output, an input coupled to the output of the first switch, and a control input for the control signals. The first and second switches can be any of the in-path switches described herein, such as switches 610 and 620 of FIG. 6, switch 810 and switch 820 of FIG. 8, or the switches implemented as transistors in FIGS. 7A and 9. The first control signals are further configured to select a closed configuration for a first shunt switch and a second shunt switch. In some aspects, the first shunt switch is configured to shunt parasitic transmission path signals from the first switch when the first switch is in the open configuration and the first shunt switch is in the closed configuration, and the second shunt switch is configured to shunt parasitic transmission path signals from the second switch when the second switch is in the open configuration and the second shunt switch is in the closed configuration. The shunt switches can be any shunt switches described herein, such as first shunt switch 630 and second shunt switch 640 of FIG. 6, first shunt switch 830 and second shunt switch 840 of FIG. 8, or the shunt switches implemented as transistors illustrated by FIGS. 9 and 7A. At block 1154, the method 1150 includes controlling the switching circuitry of the circuit in a second mode to connect the input of the switching circuitry to the output of the switching circuitry with second control signals. The second control signals are configured to: select a closed configuration for the first switch and a closed configuration for the second switch; and select an open configuration for the first shunt switch and the second shunt switch. Such operations can, for example, be used in a device implementing a receiver switch matrix (RxSM) circuit such as the RxSM circuit illustrated in FIGS. 4A and 4B. In such an illustrated circuit, switching circuitry (e.g., circuitry 600-1, 600-2, 600-3, etc.) can be operated according to method 1150 to connect a given path to a mixer, or isolate a given path from a mixer and associated output elements of the RxSM. In some such examples, the first mode isolates an input of a first path of the RxSM from a first mixer and the second mode connects the input with the first mixer via the switching circuitry. In some such examples, the first mode connects the input with a second mixer via second switching circuitry and the second mode isolates the input from the second mixer using the second switching circuitry. In other examples, other such configurations within available paths are selected by control circuitry using the operations described above of method 1150.

Additional illustrative aspects of the disclosure include:

Aspect 1. A wireless communication apparatus comprising: a first differential switch having a first and a second input, a first and a second output, and a control input; a second differential switch having a first and second input coupled to the respective first and second output of the first differential switch, the second differential switch further having a first and second output, and a control input; a shunt capacitor coupled between the first output and the second output of the first differential switch, the shunt capacitor further coupled between the first input and the second input of the second differential switch; a first shunt switch having a control input, an input, and an output, the input and the output coupled to the control input of the first differential switch; and a second shunt switch having a control input, an input, and an output, the input and the output coupled to the control input of the second differential switch.

Aspect 2. The wireless communication apparatus of aspect 1, wherein the first differential switch comprises a first transistor and a second transistor; wherein the first input of the first differential switch comprises a first terminal of the first transistor; wherein the second input of the first differential switch comprises a first terminal of the second transistor; wherein the first output of the first differential switch comprises a second terminal of the first transistor; wherein the second output of the first differential switch comprises a second terminal of the second transistor; and wherein the control input of the first differential switch comprises a gate of the first transistor and a gate of the second transistor.

Aspect 3. The wireless communication apparatus of aspects 2, wherein the first shunt switch comprises a third transistor having a drain coupled to the gate of the first transistor and a source coupled to the gate of the second transistor, and wherein the control input of the first shunt switch comprises a gate of the third transistor.

Aspect 4. The wireless communication apparatus of aspects 3, wherein the second differential switch comprises a fourth transistor and a fifth transistor; wherein the first input of the second differential switch comprises a first terminal of the fourth transistor; wherein the second input of the second differential switch comprises a first terminal of the fifth transistor; wherein the first output of the second differential switch comprises a second terminal of the fourth transistor; wherein the second output of the second differential switch comprises a second terminal of the fifth transistor; and wherein the control input of the second differential switch comprises a gate of the fourth transistor and a gate of the fifth transistor.

Aspect 5. The wireless communication apparatus of aspects 4, wherein the second shunt switch comprises a sixth transistor having a drain coupled to the gate of the fourth transistor and a source coupled to the gate of the fifth transistor, and wherein the control input of the second shunt switch further comprises a gate of the sixth transistor.

Aspect 6. The wireless communication apparatus of any of aspects 1-5, wherein the first differential switch, the second differential switch, the shunt capacitor, the first shunt switch, and the second shunt switch are part of a first receive path of a receive circuit.

Aspect 7. The wireless communication apparatus of aspect 6, further comprising: a first mixer of the receive circuit coupled to the second differential switch; and a second receive path of the receive circuit, the second receive path coupled to the first mixer.

Aspect 7A. The wireless communication apparatus of aspect 7, wherein the second receive path comprises switch circuitry, the switch circuitry comprising an output coupled to the first mixer and the second differential switch.

Aspect 8. The wireless communication apparatus of aspect 7, further comprising a transformer having a transformer differential output coupled to the first and the second input of the first differential switch.

Aspect 8A. The wireless communication apparatus of aspect 8, further comprising switch circuitry comprising a first switch connection and a second switch connection, wherein the second switch connection is coupled to an input of the transformer, and wherein the first switch connection is coupled to a low noise amplifier.

Aspect 9. The wireless communication apparatus of aspect 8, further comprising a capacitor bank coupled across the transformer differential output.

Aspect 10. The wireless communication apparatus of aspect 8 further comprising a second mixer coupled to the transformer differential output via switching circuitry.

Aspect 11. The wireless communication apparatus of any of aspects 1-7, wherein the first differential switch, the second differential switch, the first shunt switch, the second shunt switch, and the shunt capacitor are configured as a split differential t-switch.

Aspect 12. The wireless communication apparatus of aspect 11, further comprising a plurality of receive paths configured to support a plurality of communication bands, wherein the split differential t-switch is configured to isolate a first receive path from a second receive path of the plurality of receive paths.

Aspect 13. The wireless communication apparatus of aspect 7, further comprising an antenna coupled to the first receive path.

Aspect 14. The wireless communication apparatus of any of aspects 1-13, further comprising control circuitry coupled to the control input of the first differential switch, the control input of the second differential switch, the control input of the first shunt switch, and the control input of the second shunt switch.

Aspect 15. The wireless communication apparatus of aspect 14, wherein the control circuitry is configured to deselect the control input of the first differential switch and the control input of the second differential switch while selecting the control input of the first shunt switch and the control input of the second shunt switch to open the first differential switch and the second differential switch and close the first shunt switch and the second shunt switch to isolate the first and second input of the first differential switch from the first and second output of the second differential switch.

Aspect 16. The wireless communication apparatus of aspect 14, wherein the control circuitry is configured to select the control input of the first differential switch and the control input of the second differential switch while deselecting the control input of the first shunt switch and the control input of the second shunt switch to close the first differential switch and the second differential switch and open the first shunt switch and the second shunt switch.

Aspect 17. The wireless communication apparatus of aspect 15, further comprising a modem coupled to the control circuitry.

Aspect 18. A wireless communication apparatus comprising: a first switch having a first input, a first output, and a first control input; a second switch having a second input connected to the first output, a second output, and a second control input; a shunt capacitor coupled between the first output and a reference potential, wherein the shunt capacitor is further coupled between the second input and the reference potential; a first shunt switch having a third control input, a third input, and a third output, wherein the third input is coupled to the first control input, and the third output is coupled to the reference potential; and a second shunt switch having a fourth control input, a fourth input, and a fourth output, wherein the fourth input is coupled to the second control input, and the fourth output is coupled to the reference potential.

Aspect 19. The wireless communication apparatus of aspect 18, wherein the first switch is a first single-ended switch, wherein the second switch is a second single-ended switch, and wherein the first switch, the second switch, the shunt capacitor, the first shunt switch, and the second shunt switch are part of a first receive path of a receive circuit.

Aspect 20. The wireless communication apparatus of aspects 18-19, wherein the first switch includes a first transistor, the first input is a first terminal of the first transistor, the first output is a second terminal of the first transistor, and the first control input is a gate of the first transistor.

Aspect 21. The wireless communication apparatus of any of aspects 18-20, wherein the second switch includes a second transistor, wherein the second input is a first terminal of the second transistor, the second output is a second terminal of the second transistor, and the second control input is a gate of the second transistor.

Aspect 22. The wireless communication apparatus of aspect 21, wherein the second shunt switch comprises a fourth transistor having a drain coupled to the gate of the second transistor and a source coupled to the reference potential, and wherein the fourth control input further comprises a gate of the fourth transistor.

Aspect 23. The wireless communication apparatus of any of aspects 20-22, wherein the first single-ended switch, the second single-ended switch, the shunt capacitor, the first shunt switch, and the second shunt switch are part of a first receive path of a receive circuit.

Aspect 24. The wireless communication apparatus of aspect 23, further comprising: a first mixer of the receive circuit coupled to the second output of the second single-ended switch; a second receive path of the receive circuit; wherein the second output of the second single-ended switch is coupled to an output of the second receive path; and wherein the first receive path further comprises a low-noise amplifier (LNA) having an output coupled to the first input.

Aspect 25. The wireless communication apparatus of aspect 24, wherein the first single-ended switch, the second single-ended switch, the first shunt switch, the second shunt switch, and the shunt capacitor are configured as a split t-switch.

Aspect 26. The wireless communication apparatus of any of aspects 18-25, further comprising a plurality of receive paths reconfigurable to support a plurality of communication bands for a plurality of communication standards, wherein the first receive path can be isolated from the second receive path of the plurality of receive paths using the split t-switch.

Aspect 27. The wireless communication apparatus of aspect 24, further comprising an antenna coupled to the LNA.

Aspect 28. The wireless communication apparatus of any of aspects 18-27, further comprising control circuitry coupled to the first control input, the second control input, the third control input, and the fourth control input.

Aspect 29. The wireless communication apparatus of aspect 28, wherein the control circuitry is configured to deselect the first control input and the second control input while selecting the third control input and the fourth control input to open the first switch and the second input from the second output.

Aspect 30. The wireless communication apparatus of aspect 28, wherein the control circuitry is configured to select the first control input and the second control input while deselecting the third control input and the fourth control input to close the first switch and the second switch while opening the first shunt switch and the second shunt switch to couple the first input to the second output.

Aspect 31. The wireless communication apparatus of any of aspects 28-30, further comprising a modem coupled to the control circuitry.

Aspect 32. A wireless communication apparatus comprising: switching circuitry comprising: a first switch having a first input, a first output, and a first control input; a second switch having a second input electrically coupled to the first output of the first switch, a second output, and a second control input; a third switch having a third input, a third output, and a third control input; a fourth switch having a fourth input electrically coupled to the third output of the third switch, a fourth output, and a fourth control input; a capacitor electrically having a first terminal electrically coupled to a first node between the first switch and the second switch and having a second terminal electrically coupled to a second node between the third switch and the fourth switch; a fifth switch electrically coupled between the first control input and the third control input; and a sixth switch electrically coupled between the second control input and the fourth control input.

Aspect 33. The wireless communication apparatus of aspect 32 wherein the switching circuitry is coupled between a low-noise amplifier (LNA) and a mixer.

Aspect 34. The wireless communication apparatus of aspect 33 wherein the LNA has a differential output, the first input of the first switch and the third input of the third switch configured to receive a differential signal output by the LNA.

Aspect 35. The wireless communication apparatus of aspect 33 wherein the LNA is a first LNA, wherein the mixer is coupled to a receive circuit having a second LNA.

Aspect 36. The wireless communication apparatus of aspect 33 wherein the LNA is further connected to a receive path with another mixer different than the mixer.

Aspect 37. The wireless communication apparatus of any of aspects 32-36, wherein the first switch is a first transistor, wherein the second switch is a second transistor, wherein the third switch is a third transistor, wherein the fourth switch is a fourth transistor, wherein the fifth switch is a fifth transistor, and wherein the sixth switch is a sixth transistor.

Aspect 38. A wireless communication apparatus comprising: switching circuitry comprising: a first transistor having a first source, a first drain, and a first gate input; a second transistor having a second source electrically coupled to the first drain of the first transistor, wherein the second transistor has a second drain and a second gate; a third transistor having a third source, a third drain, and a third gate; a fourth transistor having a fourth source electrically coupled to the third drain of the third transistor, wherein the fourth transistor has a fourth drain, and a fourth gate; a capacitor electrically having a first terminal electrically coupled to a first node between the first drain and the second source, and the capacitor further having a second terminal electrically coupled to a second node between the third drain and the fourth source; a fifth transistor having a fifth source coupled to the third gate, a fifth drain coupled to the first gate, and a fifth gate; and a sixth transistor having a sixth source coupled to the fourth gate, a sixth drain coupled to the second gate, and a sixth gate.

Aspect 39. The wireless communication apparatus of aspect 38, wherein the first gate, the second gate, the third gate, the fourth gate, the fifth gate, and the sixth gate are electrically coupled to control circuitry that selects a switch state for the switching circuitry.

Aspect 40. The wireless communication apparatus of aspects 38-39 wherein the switching circuitry is coupled between an LNA and a mixer.

Aspect 41. The wireless communication apparatus of aspect 40 wherein the switching circuitry wherein the LNA has a differential output, the first input of the first switch and the third input of the third switch configured to receive a differential signal output by the LNA.

Aspect 42. The wireless communication apparatus of aspect 40 wherein LNA is a first LNA, wherein the mixer is coupled to a receive circuit having a second LNA.

Aspect 43. The wireless communication apparatus of aspect 40 wherein the LNA is further connected to a receive path with another mixer different than the mixer.

Aspect 44. A method for switching a signal in a wireless communication apparatus, the method comprising: receiving a signal at an input of a wireless communication apparatus, the wireless communication apparatus comprising: a first differential switch having a first differential input of the input, a first differential output, and a first control input; a second differential switch having a second differential input connected to the first differential output to form the input, a second differential output, and a second control input; a shunt capacitor coupled between a first side of the first differential output and a second side of the first differential output, wherein the shunt capacitor is further coupled between a first side of the second differential input and a second side of the second differential input; a first shunt switch having a third control input, a third input, and a third output, wherein the third input and the third output are coupled across the first control input; and a second shunt switch having a fourth control input, a fourth input, and a fourth output, wherein the fourth input and the fourth output are coupled across the second control input; receiving one or more control signals at the first control input, the second control input, the third control input, and the fourth control input; and managing transmission of the signal based on the one or more control signals.

Aspect 45. A method of operating a wireless communication apparatus using control circuitry according to any aspect herein.

Aspect 46. A computer readable storage medium comprising instructions that, when executing by control circuitry of an apparatus, causes the apparatus to control a t-switch in a receiver circuit in accordance with any aspect described herein.

Aspect 47. An apparatus comprising means for performing operations according to any aspect described herein.

Aspect 48. An apparatus comprising means for controlling switching circuitry of a circuit in a first mode to isolate an input of the switching circuitry from an output of the switching circuitry with first control signals configured to: select an open configuration for a first means for switching and an open configuration for a second means for switching; and select a closed configuration for a third means for switching and a fourth means for switching, the first means for switching configured to shunt parasitic transmission path signals from the first means for switching in the open configuration, and the fourth means for switching configured to shunt parasitic transmission path signals from the second means for switching the open configuration; and means for controlling the switching circuitry of the circuit in a second mode to connect the input of the switching circuitry to the output of the switching circuitry with second control signals.

Aspect 49. A method comprising controlling switching circuitry of a circuit in a first mode to isolate an input of the switching circuitry from an output of the switching circuitry with first control signals configured to: select an open configuration for a first switch and an open configuration for a second switch, the first switch having an input, an output, and a control input for the first control signals, and the second switch having an output, an input coupled to the output of the first switch, and a control input for the first control signals; and select a closed configuration for a first shunt switch and a second shunt switch, the first shunt switch configured to shunt parasitic transmission path signals from the first switch when the first switch is in the open configuration and the first shunt switch is in the closed configuration, and the second shunt switch configured to shunt parasitic transmission path signals from the second switch when the second switch is in the open configuration and the second shunt switch is in the closed configuration; and controlling the switching circuitry of the circuit in a second mode to connect the input of the switching circuitry to the output of the switching circuitry with second control signals configured to: select a closed configuration for the first switch and a closed configuration for the second switch; and select an open configuration for the first shunt switch and the second shunt switch.

Aspect 50. The method of claim 33, wherein the circuit is a receiver switch matrix (RxSM) circuit.

Aspect 51. The method of claim 34, wherein the first mode isolates an input of a first path of the RxSM from a first mixer; and wherein the second mode connects the input with the first mixer via the switching circuitry.

Aspect 52. The method of claim 35, wherein the first mode connects the input with a second mixer via second switching circuitry; and wherein the second mode isolates the input from the second mixer using the second switching circuitry.

Aspect 53. A wireless communication apparatus comprising: a first differential switch having a first and a second input, a first and a second output, and a control input; a second differential switch having a first and second input coupled to the respective first and second output of the first differential switch, the second differential switch further having a first and second output, and a control input; and a shunt capacitor coupled between the first output and the second output of the first differential switch, the shunt capacitor further coupled between the first input and the second input of the second differential switch.

Aspect 54. The wireless communication apparatus of aspect 53, wherein the first differential switch comprises a first transistor and a second transistor; wherein the first input of the first differential switch comprises a first terminal of the first transistor; wherein the second input of the first differential switch comprises a first terminal of the second transistor; wherein the first output of the first differential switch comprises a second terminal of the first transistor; wherein the second output of the first differential switch comprises a second terminal of the second transistor; and wherein the control input of the first differential switch comprises a gate of the first transistor and a gate of the second transistor.

Aspect 55. The wireless communication apparatus of aspects 53-54, wherein the second differential switch comprises a fourth transistor and a fifth transistor; wherein the first input of the second differential switch comprises a first terminal of the fourth transistor; wherein the second input of the second differential switch comprises a first terminal of the fifth transistor; wherein the first output of the second differential switch comprises a second terminal of the fourth transistor; wherein the second output of the second differential switch comprises a second terminal of the fifth transistor; and wherein the control input of the second differential switch comprises a gate of the fourth transistor and a gate of the fifth transistor.

Aspect 56. The wireless communication apparatus of any of aspects 53-55, wherein the first differential switch, the second differential switch, and the shunt capacitor are part of a first receive path of a receive circuit.

Aspect 57. The wireless communication apparatus of aspect 56, further comprising: a first mixer of the receive circuit coupled to the second differential switch; and a second receive path of the receive circuit, the second receive path coupled to the first mixer.

Aspect 58. The wireless communication apparatus of aspect 57, further comprising a transformer having a transformer differential output coupled to the first and the second input of the first differential switch.

Aspect 59. The wireless communication apparatus of aspect 58, further comprising a capacitor bank coupled across the transformer differential output.

Aspect 60. The wireless communication apparatus of aspect 58 further comprising a second mixer coupled to the transformer differential output via switching circuitry.

Aspect 61. The wireless communication apparatus of any of aspects 53-60, wherein the first differential switch, the second differential switch, and the shunt capacitor are configured as a split differential t-switch.

Aspect 62. The wireless communication apparatus of aspect 61, further comprising a plurality of receive paths configured to support a plurality of communication bands, wherein the split differential t-switch is configured to isolate a first receive path from a second receive path of the plurality of receive paths.

Aspect 63. The wireless communication apparatus of any of aspects 60-62, further comprising an antenna coupled to the first receive path.

Aspect 64. The wireless communication apparatus of any of aspects 53-63, further comprising control circuitry coupled to the control input of the first differential switch, and the control input of the second differential switch.

Aspect 65. The wireless communication apparatus of aspect 64, wherein the control circuitry is configured to deselect the control input of the first differential switch and the control input of the second differential switch to open the first differential switch and the second differential switch to isolate the first differential input from the second differential output.

Aspect 66. The wireless communication apparatus of aspect 64, wherein the control circuitry is configured to select the control input of the first differential switch and the control input of the second differential switch to close the first differential switch and the second differential switch.

Aspect 67. The wireless communication apparatus of any of aspects 64-66, further comprising a modem coupled to the control circuitry.

Aspect 68. A wireless communication apparatus comprising: a first switch having a first input, a first output, and a first control input; a second switch having a second input connected to the first output, a second output, and a second control input; and a shunt capacitor coupled between the first output and a reference potential, wherein the shunt capacitor is further coupled between the second input and the reference potential.

Aspect 69. The wireless communication apparatus of aspect 68, wherein the first switch is a first single-ended switch, wherein the second switch is a second single-ended switch, and wherein the first switch, the second switch, and the shunt capacitor are part of a first receive path of a receive circuit.

Aspect 70. The wireless communication apparatus of aspects 68-69, wherein the first switch includes a first transistor, the first input is a first terminal of the first transistor, the first output is a second terminal of the first transistor, and the first control input is a gate of the first transistor.

Aspect 71. The wireless communication apparatus of any of aspects 68-70, wherein the second switch includes a second transistor, wherein the second input is a first terminal of the second transistor, the second output is a second terminal of the second transistor, and the second control input is a gate of the second transistor.

Aspect 72. The wireless communication apparatus of any of aspects 68-71, wherein the first single-ended switch, the second single-ended switch, and the shunt capacitor are part of a first receive path of a receive circuit.

Aspect 73. The wireless communication apparatus of aspect 72, further comprising: a first mixer of the receive circuit coupled to the second output of the second single-ended switch; a second receive path of the receive circuit; wherein the second output of the second single-ended switch is coupled to an output of the second receive path; and wherein the first receive path further comprises a low-noise amplifier (LNA) having an output coupled to the first input.

Aspect 74. The wireless communication apparatus of aspect 73, wherein the first single-ended switch, the second single-ended switch, and the shunt capacitor are configured as a split t-switch.

Aspect 75. The wireless communication apparatus of any of aspects 68-74, further comprising a plurality of receive paths reconfigurable to support a plurality of communication bands for a plurality of communication standards, wherein the first receive path can be isolated from the second receive path of the plurality of receive paths using the split t-switch.

Aspect 76. The wireless communication apparatus of aspect 75, further comprising an antenna coupled to the first receive path.

Aspect 77. The wireless communication apparatus of any of aspects 68-76, further comprising control circuitry coupled to the first control input, the second control input, the third control input, and the fourth control input.

Aspect 78. The wireless communication apparatus of aspect 77, wherein the control circuitry is configured to deselect the first control input and the second control input while selecting the third control input and the fourth control input to open the first switch and the second input from the second output.

Aspect 79. The wireless communication apparatus of aspect 78, wherein the control circuitry is configured to select the first control input and the second control input while deselecting the third control input and the fourth control input to close the first switch and the second switch to couple the first input to the second output.

Aspect 80. The wireless communication apparatus of aspects 78-79, further comprising a modem coupled to the control circuitry.

Figure 12:
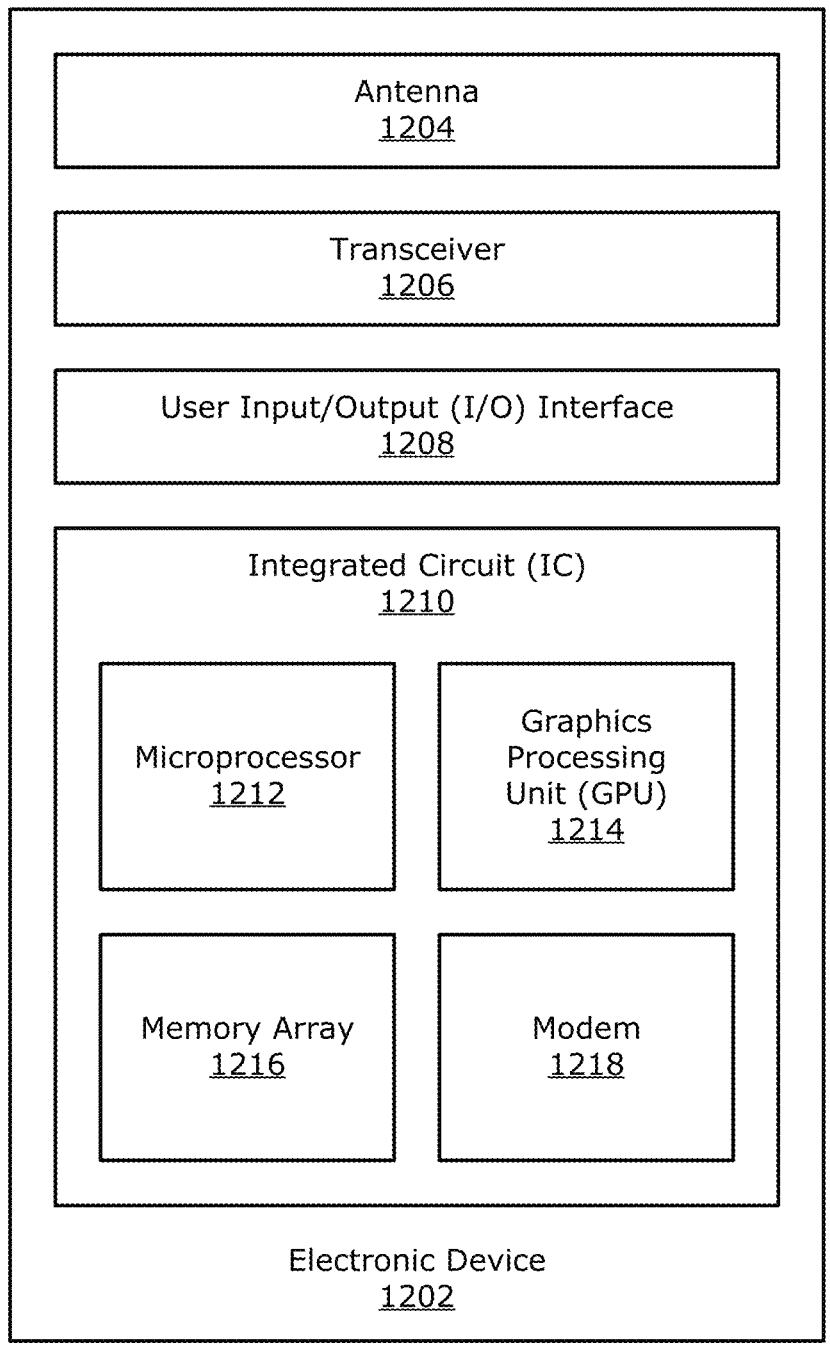
FIG. 12 illustrates an example electronic device, which includes a transceiver that can implement a t-switch in accordance with examples described herein.

FIG. 12 illustrates an example electronic device 1202, which includes a transceiver 1206 that can implement a t-switch in accordance with examples described herein. IC 1210 can, for example, act as control circuitry to send control signals to control inputs of one or more t-switches implemented in transceiver 1206 in accordance with any of switch circuitry 600, 700, 800, or 900. As shown, the electronic device 1202 includes an antenna 1204, a transceiver 1206, and a user input/output (I/O) interface 1208, in addition to the integrated circuit 1210. Illustrated examples of the integrated circuit 1210, or cores thereof, include a microprocessor 1212, a graphics processing unit (GPU) 1214, a memory array 1216, and a modem 1218. Each component can be operably coupled to another component, such as the GPU 1214 being operably coupled to the user I/O interface 1208.

The electronic device 1202 can be a mobile or battery-powered device or a fixed device that is designed to be powered by an electrical grid. Examples of the electronic device 1202 include a server computer, a network switch or router, a blade of a data center, a personal computer, a desktop computer, a notebook or laptop computer, a tablet computer, a smart phone, an entertainment appliance, or a wearable electronic device such as a smartwatch, intelligent glasses, or an article of clothing. An electronic device 1202 can also be a device, or a portion thereof, having embedded electronics. Examples of the electronic device 1202 with embedded electronics include a passenger vehicle, industrial equipment, a refrigerator or other home appliance, a drone or other unmanned aerial vehicle (UAV), or a power tool.

For an electronic device with a wireless capability, the electronic device 1202 includes an antenna 1204 that is coupled to a transceiver 1206 to enable reception or transmission of one or more wireless signals. The integrated circuit 1210 may be coupled to the transceiver 1206 to enable the integrated circuit 1210 to have access to received wireless signals or to provide wireless signals for transmission via the antenna 1204. The electronic device 1202 as shown also includes at least one user I/O interface 1208. Examples of the user I/O interface 1208 include a keyboard, a mouse, a microphone, a touch-sensitive screen, a camera, an accelerometer, a haptic mechanism, a speaker, a display screen, or a projector. The transceiver 1206 can correspond to, for example, the wireless transceiver 122 (e.g., of FIG. 1 and FIG. 2) and can include a receive path or receive circuit (e.g., receive circuit 400) with a t-switch in accordance with examples described herein.

The integrated circuit 1210 may comprise, for example, one or more instances of a microprocessor 1212, a GPU 1214, a memory array 1216, a modem 1218, and so forth. The microprocessor 1212 may function as a central processing unit (CPU) or other general-purpose processor. Some microprocessors include different parts, such as multiple processing cores, that may be individually powered on or off. The GPU 1214 may be especially adapted to process visual related data for display, such as video data images. If visual-related data is not being rendered or otherwise processed, the GPU 1214 may be fully or partially powered down. The memory array 1216 stores data for the microprocessor 1212 or the GPU 1214. Example types of memory for the memory array 1216 include random access memory (RAM), such as dynamic RAM (DRAM) or static RAM (SRAM); flash memory; and so forth. If programs are not accessing data stored in memory, the memory array 1216 may be powered down overall or block-by-block. The modem 1218 demodulates a signal to extract encoded information or modulates a signal to encode information into the signal. If there is no information to decode from an inbound communication or to encode for an outbound communication, the modem 1218 may be idled to reduce power consumption. The integrated circuit 1210 may include additional or alternative parts than those that are shown, such as an I/O interface, a sensor such as an accelerometer, a transceiver or another part of a receiver chain, a customized or hard-coded processor such as an application-specific integrated circuit (ASIC), and so forth.

The integrated circuit 1210 may also comprise a system on chip (SoC). An SoC may integrate a sufficient number of different types of components to enable the SoC to provide computational functionality as a notebook computer, a mobile phone, or another electronic apparatus using one chip, at least primarily. Components of an SoC, or an integrated circuit 1210 generally, may be termed cores or circuit blocks. Examples of cores or circuit blocks include, in addition to those that are illustrated in FIG. 12, a voltage regulator, a main memory or cache memory block, a memory controller, a general-purpose processor, a cryptographic processor, a video or image processor, a vector processor, a radio, an interface or communications subsystem, a wireless controller, or a display controller. Any of these cores or circuit blocks, such as a central processing unit or a multimedia processor, may further include multiple internal cores or circuit blocks.

Specific details are provided in the description above to provide a thorough understanding of the embodiments and examples provided herein. However, it will be understood by one of ordinary skill in the art that the embodiments may be practiced without these specific details. For clarity of explanation, in some instances the present technology may be presented as including individual functional blocks comprising devices, device components, steps or routines in a method embodied in software, or combinations of hardware and software. Additional components may be used other than those shown in the figures and/or described herein. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Individual embodiments may be described above as a process or method which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

Processes and methods according to the above-described examples can be implemented using computer-executable instructions that are stored or otherwise available from computer-readable media. Such instructions can include, for example, instructions and data which cause or otherwise configure a general purpose computer, special purpose computer, or a processing device to perform a certain function or group of functions. Portions of computer resources used can be accessible over a network. The computer executable instructions may be, for example, binaries, intermediate format instructions such as assembly language, firmware, source code. Examples of computer-readable media that may be used to store instructions, information used, and/or information created during methods according to described examples include magnetic or optical disks, flash memory, USB devices provided with non-volatile memory, networked storage devices, and so on.

Devices implementing processes and methods according to these disclosures can include hardware, software, firmware, middleware, microcode, hardware description languages, or any combination thereof, and can take any of a variety of form factors. When implemented in software, firmware, middleware, or microcode, the program code or code segments to perform the necessary tasks (e.g., a computer-program product) may be stored in a computer-readable or machine-readable medium. A processor(s) may perform the necessary tasks. Typical examples of form factors include laptops, smart phones, mobile phones, tablet devices or other small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are example means for providing the functions described in the disclosure.

In the foregoing description, aspects of the application are described with reference to specific embodiments thereof, but those skilled in the art will recognize that the application is not limited thereto. Thus, while illustrative embodiments of the application have been described in detail herein, it is to be understood that the inventive concepts may be otherwise variously embodied and employed, and that the appended claims are intended to be construed to include such variations, except as limited by the prior art. Various features and aspects of the above-described application may be used individually or jointly. Further, embodiments can be utilized in any number of environments and applications beyond those described herein without departing from the broader spirit and scope of the specification. The specification and drawings are, accordingly, to be regarded as illustrative rather than restrictive. For the purposes of illustration, methods were described in a particular order. It should be appreciated that in alternate embodiments, the methods may be performed in a different order than that described.

One of ordinary skill will appreciate that the less than ("<") and greater than (">") symbols or terminology used herein can be replaced with less than or equal to ("≤") and greater than or equal to ("≥") symbols, respectively, without departing from the scope of this description.

Where components are described as being "configured to" perform certain operations, such configuration can be accomplished, for example, by designing electronic circuits or other hardware to perform the operation, by programming programmable electronic circuits (e.g., microprocessors, or other suitable electronic circuits) to perform the operation, or any combination thereof.

The phrase "coupled to" refers to any component that is physically connected to another component either directly or indirectly, and/or any component that is in communication with another component (e.g., connected to the other component over a wired or wireless connection, and/or other suitable communication interface) either directly or indirectly.

Claim language or other language reciting "at least one of" a set and/or "one or more" of a set indicates that one member of the set or multiple members of the set (in any combination) satisfy the claim. For example, claim language reciting "at least one of A and B" or "at least one of A or B" means A, B, or A and B. In another example, claim language reciting "at least one of A, B, and C" or "at least one of A, B, or C" means A, B, C, or A and B, or A and C, or B and C, or A and B and C. The language "at least one of" a set and/or "one or more" of a set does not limit the set to the items listed in the set. For example, claim language reciting "at least one of A and B" or "at least one of A or B" can mean A, B, or A and B, and can additionally include items not listed in the set of A and B.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

The various illustrative logical blocks, modules, circuits, and algorithm steps described in connection with the examples disclosed herein may be implemented as electronic hardware, computer software, firmware, or combinations thereof. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present application.

The techniques described herein may also be implemented in electronic hardware, computer software, firmware, or any combination thereof. Such techniques may be implemented in any of a variety of devices such as general purposes computers, wireless communication device handsets, or integrated circuit devices having multiple uses including application in wireless communication device handsets and other devices. Any features described as modules or components may be implemented together in an integrated logic device or separately as discrete but interoperable logic devices. If implemented in software, the techniques may be realized at least in part by a computer-readable data storage medium comprising program code including instructions that, when executed, performs one or more of the methods, algorithms, and/or operations described above. The computer-readable data storage medium may form part of a computer program product, which may include packaging materials. The computer-readable medium may comprise memory or data storage media, such as random access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, and the like. The techniques additionally, or alternatively, may be realized at least in part by a computer-readable communication medium that carries or communicates program code in the form of instructions or data structures and that can be accessed, read, and/or executed by a computer, such as propagated signals or waves.

The program code may be executed by a processor, which may include one or more processors, such as one or more digital signal processors (DSPs), general purpose microprocessors, an application specific integrated circuits (ASICs), field programmable logic arrays (FPGAs), or other equivalent integrated or discrete logic circuitry. Such a processor may be configured to perform any of the techniques described in this disclosure. A general purpose processor may be a microprocessor; but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Accordingly, the term "processor," as used herein may refer to any of the foregoing structure, any combination of the foregoing structure, or any other structure or apparatus suitable for implementation of the techniques described herein.

What is claimed is:

1. A receive circuit in a wireless communication apparatus, the receive circuit comprising:
    a first mixer;
    a second mixer;
    a first receive path coupled to the first mixer and the second mixer, the first receive path comprising:
        a first low noise amplifier having an output;
        a first switch having an input and an output, wherein the input of the first switch is coupled to the output of the first low noise amplifier;
        a first transformer having an output and an input coupled to the output of the first switch;
        a first switch circuit comprising a first T-switch, wherein the first switch further comprises an input coupled to the output of the first transformer, and an output coupled to the first mixer; and
        a second switch circuit comprising a second T-switch, wherein the second switch circuit comprises an input coupled to the output of the first transformer, and an output coupled to the second mixer; and
    a second receive path coupled to the second mixer, the second receive path comprising:
        a second low noise amplifier having an output;
        a second switch having an input and an output, wherein the input of the second switch is coupled to the output of the second low noise amplifier;
        a second transformer having an output and an input coupled to the output of the second switch; and
        a third switch circuit comprising a third T-switch, wherein the third switch circuit comprises an input coupled to the output of the second transformer and an output coupled to the first mixer.

2. The receive circuit of claim 1, wherein the first T-switch comprises a shunt capacitor and one or more shunt switches.

3. The receive circuit of claim 1, wherein the first receive path further comprises a capacitor bank coupled between an output of the first transformer and an input of the first switch circuit.

4. The receive circuit of claim 1, wherein the first T-switch comprises:
    a first differential switch having a first input and a second input, a first output and a second output, and a control input;
    a second differential switch having a first input and a second input coupled to the respective first and second output of the first differential switch, the second differential switch further having a first output and a second output, and a control input;
    a shunt capacitor coupled between the first output and the second output of the first differential switch, the shunt capacitor further coupled between the first input and the second input of the second differential switch;
    a first shunt switch of one or more shunt switches having a control input, an input, and an output, the input and the output coupled to the control input of the first differential switch; and
    a second shunt switch of the one or more shunt switches having a control input, an input, and an output, the input and the output coupled to the control input of the second differential switch.

5. The receive circuit of claim 4, wherein the first differential switch comprises a first transistor and a second transistor;
    wherein the first input of the first differential switch comprises a first terminal of the first transistor;
    wherein the second input of the first differential switch comprises a first terminal of the second transistor;
    wherein the first output of the first differential switch comprises a second terminal of the first transistor;
    wherein the second output of the first differential switch comprises a second terminal of the second transistor; and
    wherein the control input of the first differential switch comprises a gate of the first transistor and a gate of the second transistor.

6. The receive circuit of claim 5, wherein the first shunt switch comprises a third transistor having a drain coupled to the gate of the first transistor and a source coupled to the gate of the second transistor, and wherein the control input of the first shunt switch comprises a gate of the third transistor.

7. The receive circuit of claim 6, wherein the second differential switch comprises a fourth transistor and a fifth transistor;
  wherein the first input of the second differential switch comprises a first terminal of the fourth transistor;
  wherein the second input of the second differential switch comprises a first terminal of the fifth transistor;
  wherein the first output of the second differential switch comprises a second terminal of the fourth transistor;
  wherein the second output of the second differential switch comprises a second terminal of the fifth transistor; and
  wherein the control input of the second differential switch comprises a gate of the fourth transistor and a gate of the fifth transistor.

8. The receive circuit of claim 7, wherein the second shunt switch comprises a sixth transistor having a drain coupled to the gate of the fourth transistor and a source coupled to the gate of the fifth transistor, and wherein the control input of the second shunt switch further comprises a gate of the sixth transistor.

9. The receive circuit of claim 4, wherein the control input of the first differential switch, the control input of the second differential switch, the control input of the first shunt switch, and the control input of the second shunt switch are coupled to control circuitry of the wireless communication apparatus.

10. The receive circuit of claim 9, wherein the control circuitry is configured to deselect the control input of the first differential switch and the control input of the second differential switch while selecting the control input of the first shunt switch and the control input of the second shunt switch to open the first differential switch and the second differential switch and close the first shunt switch and the second shunt switch to isolate the first and second input of the first differential switch from the first and second output of the second differential switch.

11. The receive circuit of claim 9, wherein the control circuitry is configured to select the control input of the first differential switch and the control input of the second differential switch while deselecting the control input of the first shunt switch and the control input of the second shunt switch to close the first differential switch and the second differential switch and open the first shunt switch and the second shunt switch.

12. The receive circuit of claim 1, wherein the first t-switch and the second t-switch are each configured as a split differential t-switch.

13. The receive circuit of claim 1, wherein the first receive path and the second receive path are configured to support a plurality of communication bands, and wherein the second t-switch and the third T-switch are configured to isolate the first receive path from the second receive path.

14. A method comprising:
  controlling a first mode of a receive circuit in a wireless communication apparatus to isolate a first input of the receive circuit from an output of the receive circuit and connect a second input of the receive circuit to the output, wherein the wireless communication apparatus the comprises the receive circuit and control circuitry coupled to the receive circuit; and
  controlling a second mode of the receive circuit to connect the first input of the receive circuit to the output of the receive circuit and isolate the second input of the receive circuit from the second switch; and;
  wherein the receive circuit comprises:
  a first mixer;
  a second mixer;
  a first receive path coupled to the first mixer and the second mixer, the first receive path comprising:
    a first low noise amplifier having an output;
    a first switch having an input and an output, wherein the input of the first switch is coupled to the output of the first low noise amplifier;
    a first transformer having an output and an input coupled to the output of the first switch;
    a first switch circuit comprising a first T-switch, wherein the first switch further comprises an input coupled to the output of the first transformer, and an output coupled to the first mixer; and
    a second switch circuit comprising a second T-switch, wherein the second switch circuit comprises an input coupled to the output of the first transformer, and an output coupled to the second mixer; and
  a second receive path coupled to the second mixer, the second receive path comprising:
    a second low noise amplifier having an output;
    a second switch having an input and an output, wherein the input of the second switch is coupled to the output of the second low noise amplifier;
    a second transformer having an output and an input coupled to the output of the second switch; and
    a third switch circuit comprising a third T-switch, wherein the third switch circuit comprises an input coupled to the output of the second transformer and an output coupled to the first mixer.

15. The method of claim 14, wherein the first T-switch comprises:
  a first differential switch having a first input and a second input, a first output and a second output, and a control input;
  a second differential switch having a first input and a second input coupled to the respective first and second output of the first differential switch, the second differential switch further having a first output and a second output, and a control input;
  a shunt capacitor coupled between the first output and the second output of the first differential switch, the shunt capacitor further coupled between the first input and the second input of the second differential switch;
  a first shunt switch of one or more shunt switches having a control input, an input, and an output, the input and the output coupled to the control input of the first differential switch; and
  a second shunt switch of the one or more shunt switches having a control input, an input, and an output, the input and the output coupled to the control input of the second differential switch.

16. The method of claim 15, wherein the control circuitry is coupled to the control input of the first differential switch, the control input of the second differential switch, the control input of the first shunt switch, and the control input of the second shunt switch.

17. The method of claim 16, further comprising:
  deselecting the control input of the first differential switch and the control input of the second differential switch while selecting the control input of the first shunt switch and the control input of the second shunt switch to open the first differential switch and the second differential switch and close the first shunt switch and the second shunt switch to isolate the first and second input of the first differential switch from the first and second output of the second differential switch.

18. The method of claim 16, further comprising:
selecting the control input of the first differential switch and the control input of the second differential switch while deselecting the control input of the first shunt switch and the control input of the second shunt switch to close the first differential switch and the second differential switch and open the first shunt switch and the second shunt switch.

19. The method of claim 15, wherein the first T-switch comprises a shunt capacitor and one or more shunt switches.

\* \* \* \* \*